United States Patent
Murakami et al.

(10) Patent No.: US 6,518,493 B1
(45) Date of Patent: Feb. 11, 2003

(54) DISPLAY DEVICE FOR ELECTRONIC APPARATUS COMPRISING SOLAR CELL

(75) Inventors: Tomomi Murakami, Nishitokyo (JP); Shin-ichi Sakamaki, Nishitokyo (JP); Yoshiya Tanaka, Nishitokyo (JP); Katsuyuki Yamaguchi, Nishitokyo (JP)

(73) Assignee: Citizen Watch Co., Ltd., Tokyo (JP)

( * ) Notice: Subject to any disclaimer, the term of this patent is extended or adjusted under 35 U.S.C. 154(b) by 0 days.

(21) Appl. No.: 09/889,082

(22) PCT Filed: Nov. 9, 2000

(86) PCT No.: PCT/JP00/07895

§ 371 (c)(1),
(2), (4) Date: Jul. 11, 2001

(87) PCT Pub. No.: WO01/37350

PCT Pub. Date: May 25, 2001

(30) Foreign Application Priority Data

Nov. 12, 1999 (JP) .......................... 11-322329

(51) Int. Cl.[7] .................. H01L 31/04; G04B 19/06
(52) U.S. Cl. ............... 136/257; 136/246; 136/252; 136/259; 136/251; 136/256; 136/291; 136/244; 368/205; 438/65; 427/74; 427/163.1; 264/1.31; 264/220; 264/241
(58) Field of Search .................. 136/246, 257, 136/291, 244, 252, 259, 251, 256; 368/205; 438/65; 427/74, 163.1; 264/1.31, 220, 241

(56) References Cited

U.S. PATENT DOCUMENTS 3,823,551 A * 7/1974 Riehl .................... 368/66
4,139,279 A * 2/1979 Laesser et al. .......... 349/115
5,841,738 A * 11/1998 Kamei et al. ............ 368/205

FOREIGN PATENT DOCUMENTS

| JP | 58-48687 A | * | 3/1983 |
| JP | 5-38464 B2 | | 6/1993 |
| JP | 7-198866 A | * | 8/1995 |
| JP | 9-292474 A | * | 11/1997 |
| JP | 10-123265 A | * | 5/1998 |
| JP | 11-23738 A | * | 1/1999 |
| JP | 11-298026 A | * | 10/1999 |
| JP | 2000-221214 A | * | 8/2000 |

* cited by examiner

Primary Examiner—Alan Diamond
(74) Attorney, Agent, or Firm—Webb Ziesenheim Logsdon Orkin & Hanson, P.C.

(57) ABSTRACT

In a display device for an electronic apparatus, a circular polarizing plate constituted by a linear polarizing plate 42 and a ¼λ plate 43 is provided between a solar display board 41 and a middle frame 46 for fixing a module 45 having a solar cell 44 to an outer case. As a result, a boundary line between the middle frame 46 and the solar cell 44, a gate track generated through injection molding of the middle frame 46, and further more, a solar cell element dividing line of the solar cell 44 cannot be seen. Consequently, a variation in design of the solar display board 41 can be increased. Moreover, the color of the solar display board 41 is deepened so that a feeling of high quality can be obtained as goods, and the provision of the middle frame can provide various external shapes of a watch in respect of the design.

53 Claims, 17 Drawing Sheets

DISPLAY DEVICE FOR ELECTRONIC APPARATUS COMPRISING SOLAR CELL

FIELD OF THE INVENTION

The present invention relates to a display device for an electronic apparatus comprising a solar cell, for example, an electronic apparatus such as a watch, an electronic calculator, a radio, a battery charger, and more particularly the watch.

BACKGROUND ART

An example of a conventional structure of a watch having a solar cell 305 will be described in detail with reference to FIG. 26. FIG. 26(a) is a plan view showing the inside of the watch case seen from above and FIG. 26(b) is a schematic sectional view showing the inside of the watch case.

As shown in FIG. 26, when light is incident on a solar display board 301 of a watch from the outside, the light is transmitted through the solar display board 301 to reach the solar cell 305. Then, the solar cell 305 converts an optical energy into an electric energy which is charged into a battery or capacitor referred to as a secondary battery which is provided in a module 307 and can store electricity. The module 307 includes a drive mechanism for the watch so that a minute hand 310 and an hour hand 309 which are fixed to a central shaft 308 are moved thereby. In this case, the solar display board 301 is positioned between the minute hand 310 and hour hand 309 and the solar cell 305.

In recent years, the power generation efficiency of the solar cell has been enhanced, the power consumption of a module has been reduced, and furthermore, battery performance has been improved. Consequently, even if the external shape of a solar cell is much smaller than ever, a minute hand and an hour hand can be driven.

On the other hand, the degree of freedom has been increased for the external shape of a watch case depending on the diversification of the design of the watch. A middle frame 306 is positioned on the outside of the solar cell 305 and the module 307 so that the degree of freedom can be enhanced in respect of the design of the external shape of the watch.

As shown in FIGS. 26(a) and (b), the solar cell 305 and the module 307 are fixed through the middle frame 306 to an outer case which is not shown. Moreover, the minute hand 310 and the hour hand 309 are bonded to the central shaft 308 which extends from the module 307 and are rotated through a driving force applied from the module 307. Furthermore, the solar display board 301 is provided to cover the solar cell 305 and the middle frame 306.

The middle frame 306 is provided with a hook mechanism in order to fix the module 307 to which the solar cell 305 is fastened, which is not shown. When the module 307 is fitted in the middle frame 306, the solar cell 305 and the module 307 are fixed to the middle frame 306 and are accommodated in the outer case and thus fixed therein.

The solar cell 305 has two kinds of substrates, that is, substrates formed of a glass and a resin. For both of them, the solar cell itself has a small thickness. Furthermore, there is a possibility that the substrate formed of a glass might be chipped through a stress such as a shock during or after assembly. The substrate formed of a resin might be deformed by a stress thereof during bonding. For a method of fixation to the watch case, therefore, the solar cell 305 and the middle frame 306 are not fixed but the module 307 and the middle frame 306 are fixed. In the case of the substrate formed of a resin, a metal plate may be provided on the lower face of the solar cell 305 in order to enhance the reliability of rigidity and electrical connection.

Furthermore, in the case in which the solar display board 301 comes in contact with the solar cell 305, the power generation efficiency of the solar cell 305 might be reduced due to a flaw or the like. Therefore, the middle frame 306 also has the function of preventing the reduction of the power generation. When the solar display board 301 is superposed on the solar cell 305, the middle frame 306 protrudes slightly upward from the upper face of the solar cell 305 such that the middle frame 306 comes in contact with the solar display board 301 earlier than the solar cell 305.

Moreover, in the case in which the module 307 having the solar cell 305 fixed thereto is to be incorporated into the middle frame 306, the incorporation can easily be carried out efficiently and productivity can be enhanced if the external shape of the solar cell 305 is coincident with that of the module 307 as shown. As described above in detail, the middle frame is a member which plays an important role in watch construction.

As shown in FIG. 26(a), a boundary line 303 between the solar cell 305 and the middle frame 306 usually requires a clearance for watch assembling work and the clearance is seen to be black through the solar display board 301. Moreover, a plastic material is often used for the middle frame 306 in consideration of easiness of molding, cost, shock absorption and the like. The middle frame 306 is manufactured by injection molding to correspond to the shape of various outer cases. Therefore, a gate track 304 is formed on an upper face of the middle frame 306 due to the injection molding and the gate track 304 is also seen through the solar display board 301. Furthermore, in the case in which a solar cell is divided into some elements to maintain a predetermined voltage and current, a refractive index of light is varied depending on a difference in a material between a cell portion and a dividing line portion and a solar cell element dividing line 302 is also seen through the solar display board 301.

According to the knowledge of the present inventors, such a phenomenon remarkably presents itself when the solar display board 301 is black or blue. FIG. 26 shows an example in which the solar cell element dividing line 302 has a cross-shape and the boundary line 303 between the solar cell 305 and the middle frame 306 has the shape of a black ring on the boundary between a slant line portion and a dotted portion.

For a technique for seeing such a solar cell element dividing line with difficulty, a method disclosed in Japanese Patent Publication No. Hei 5-38464 has conventionally been proposed.

In the Japanese Patent Publication No. Hei 5-38464, only a color diffusing board is provided between the solar display board 301 and the solar cell 305. However, the diffusing board has the function of diffusing light. Therefore, the boundary line 303 between the solar cell 305 and the middle frame 306, the gate track 304 generated through the injection molding of the middle frame, and furthermore, the solar cell element dividing line 302 are seen with difficulty. As a result, they are necessarily seen to be white so that the tone of the solar display board 301 provided thereabove is affected.

According to an experiment carried out by the present inventors, if only the color diffusing board is provided between the solar display board 301 and the solar cell 305, a black solar display board is seen to be gray, which is not preferable in respect of design. Moreover, a white solar display board has diffusion effects by itself. Therefore, even if the diffusing board is not used, there is not such a phenomenon that the boundary line 303 between the solar cell 305 and the middle frame 306, the gate track 304 generated through the injection molding of the middle frame 306, and furthermore, the solar cell element dividing line 302 are seen through the solar display board 301. Therefore, it is not necessary to provide the diffusing board as in the Japanese Patent Publication No. Hei 5-38464.

Usually, various designs are given through the solar display board 301. If there is such a phenomenon that the boundary line 303, the gate track 304 and the solar cell element dividing line 302 are seen as described above, the quality of design of a watch is adversely affected. More specifically, in this case, a decoration or the like should be given to a part of the solar display board 301 or the whole surface thereof in order to hide the above-mentioned phenomenon. Therefore, the design for the solar display board 301 is restricted so that a feeling of high quality for a watch is eliminated.

In the three phenomena adversely affecting the design quality as described above, the solar cell element dividing line 302 can be considerably improved by giving a protective coat formed of an epoxy resin which has $SiO_2$ particulates distributed therein over the whole surface of the solar cell 305. Moreover, there is a possibility that the gate track 304 generated during the injection molding of the middle frame 306 can also be improved by changing a gate position. However, the boundary line 303 between the solar cell 305 and the middle frame 306, that is, the clearance cannot be avoided for the watch assembling work and is the most harmful and measures are taken with difficulty.

In the experiment carried out by the present inventors, the colors of black and blue solar display boards are caused to be deeper, a feeling of high quality can be obtained for goods by the deeper colors, and furthermore, it is possible to eliminate such a drawback that the observation through the solar display board described above is caused. However, transmitted light does not fully reach the solar cell itself so that the power generation efficiency is reduced and the operation of the watch is stopped.

Moreover, when the tone of the middle frame is adapted to that of the solar cell, it is possible to eliminate such a drawback that the observation through the solar display board described above is caused. However, the boundary line between the solar cell and the middle frame is seen so that the drawback cannot be eliminated completely. Furthermore, when a white paint is thinly applied to the solar cell side of the blue solar display board having a blue resin kneaded therein, it is possible to eliminate such a phenomenon that the boundary line 303 between the solar cell 305 and the middle frame 306, the gate track 304 generated through the injection molding of the middle frame 306, and furthermore, the solar cell element dividing line 302 are seen through the solar display board 301. However, the depth of the color of the solar display board 301 is eliminated by the diffusing function of the white paint so that the feeling of high quality for the single solar display board disappears. In otherwords, the formation of a diffusion layer cannot obtain sufficient effects.

In a display board such as a watch dial, various coloring and patterns are applied to the surface or back of the display board or both of them in order to give a feeling of high quality (added value) in some cases. The coloring is carried out by printing the surface of a material to be the display board or manufacturing the display board from a resin containing a pigment, for example. In the case of a metallic display board, moreover, the pattern on the surface thereof is formed through etching, a matte processing or the like. In the case of a display board formed of a resin, a pattern is formed by injection molding the resin in a mold having the pattern formed therein.

However, the above-mentioned display boards are not satisfactory in respect of the depth of a pattern, a three-dimensional effect and the like.

In consideration of such circumstances, it is an object of the present invention to provide a display device for an electronic apparatus comprising a solar cell and a middle frame for fixing the solar cell and a module to an outer case in which necessary and sufficient light can be caused to reach the solar cell, a feeling of high quality can be given, and furthermore, it is possible to increase a variation in design in which a decorative property is great and the depth of a pattern and a three-dimensional effect are excellent.

SUMMARY OF THE INVENTION

The present invention solves the problems of the conventional art described above by providing a display device for an electronic apparatus comprising a solar cell, wherein a circular polarizing plate for transmitting light is provided on the front side of the solar cell in a direction of incidence of light.

In a circular polarizing plate constituted by a linear polarizing plate and a phase difference plate, the linear polarizing plate and the phase difference plate are provided in this order in a direction of incidence of light. Consequently, light reflected by a solar cell surface can be blocked, a boundary line between the solar cell and the middle frame, a gate track generated through injection molding of the middle frame, and a solar cell element dividing line cannot be seen through the circular polarizing plate.

Consequently, the tone of the solar display board is not affected. Moreover, it is not necessary to hide the three drawbacks through a stripe-shaped pattern or the like. Thus, a variation in design of the solar display board can be increased. Furthermore, a solar display board having a deep color can be used so that a feeling of high quality can visually be obtained as goods. By directly giving marking such as a numeral to the linear polarizing plate by means of printing or the like, the function of the solar display board can also be given to the linear polarizing plate itself.

Moreover, the present invention is characterized in that the surface of the circular polarizing plate is provided with a solar display board constituted by a resin substrate having a pattern, an in organic substrate having a pattern or a decorating thin film member or a combination thereof.

Therefore, a decorative property is great, the pattern becomes rich and an excellent three-dimensional effect can be obtained. Through a combination of two or more patterns or two or more materials, moreover, it is possible to manufacture a display board having a better feeling of beauty than ever. Thus, a design variation can be increased.

By such a structure, it is possible to provide a display device for an electronic apparatus comprising a solar cell capable of maintaining the necessary and sufficient power generation efficiency of the solar cell, giving a feeling of high quality and increasing a variation in design.

BRIEF DESCRIPTION OF THE DRAWINGS

FIG. 16 is a partially enlarged sectional view showing a solar display board according to a fourteenth embodiment of the present invention.

DETAILED DESCRIPTION THE INVENTION

Figure 1:
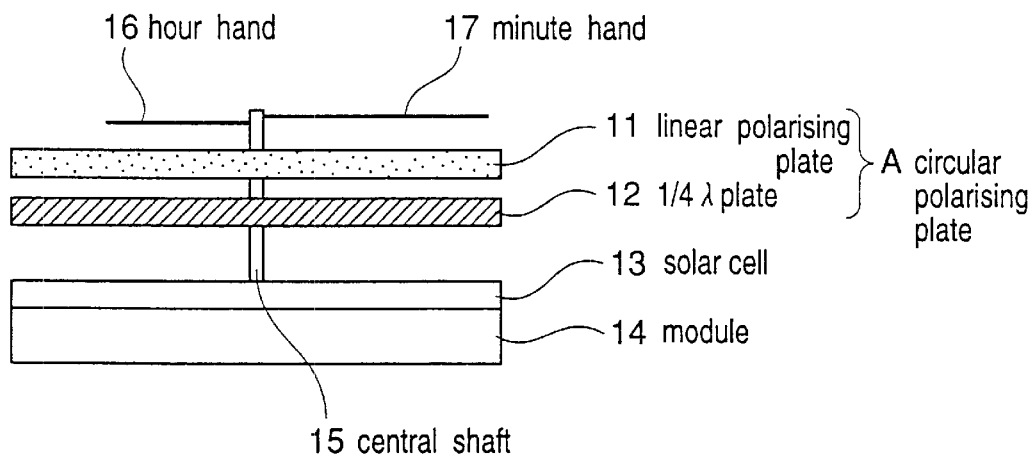
FIG. 1 is a schematic sectional view showing the inside of a watch case according to a first embodiment of the present invention.

Embodiments of the present invention will be described below.

First of all, the function of a circular polarizing plate will be described with reference to FIGS. 27 to 29.

The circular polarizing plate is usually fabricated by bonding a linear polarizing plate 111 formed of a film material to a ¼ λ plate 112 formed of a film material with an adhesive layer. As a matter of course, if the circular polarizing plate has the circular polarizing function, other structures and members maybe used. Moreover, the linear polarizing plate may have such a structure that a polyvinyl alcohol thin film absorbing iodine is extended in one direction and molecules are arranged in parallel and are sandwiched with acetylbutyl cellulose. Furthermore, a lens or lens group for collecting light in one direction maybe used. Since mirror reflection can be suppressed, the linear polarizing plate is used for improving a contrast or lessening the fatigue of eyes.

The linear polarizing plate 111 has an absorption type or a reflection type. An absorption axis or a reflection axis is present orthogonally to a transmission axis. When natural light for oscillation in every direction is incident on the linear polarizing plate 111 as shown in FIG. 27, only light in the same oscillating direction as the transmission axis is transmitted. In the absorption type, the light incident on the linear polarizing plate 111 is absorbed in the polarizing plate. Moreover, the reflection type has the function of reflecting the light incident on the linear polarizing plate 111 from a surface of the polarizing plate.

The embodiments according to the present invention will be described by using an absorption type linear polarizing plate and a ¼ λ plate as the linear polarizing plate and the phase difference plate if special description is not given.

The transmitted light polarized in one direction is incident at an angle of 45° with respect to a delay axis of the phase difference plate. In this case, the phase difference plate represents the ¼ λ plate 112, and divides the light incident at 45° λ into x and y directions for convenience and regards both maximum amplitudes as 1 as shown in FIG. 28. An axis of abscissa indicates an angle and an axis of ordinate indicates an amplitude, and the relationship between a wavelength and a phase is such that one wavelength is 360° (λ). If the delay axis of the phase difference plate is set to the y direction, the presence of the phase difference plate causes the light transmitted through the phase difference plate to be delayed by a ¼ λ phase in only the y direction.

The case in which the light advances by ¾ wavelength through the ¼ λ plate 112 will be supposed. The light is not delayed in the x direction and is delayed by ¼ λ in the y direction as shown in a solid line from a waveform shown in a one-dotted chain line. Therefore, a point A (−1, 0) is obtained in FIGS. 28 and 29. Moreover, when the light further advances by ¼ λ, a point B (0, 1) is obtained in FIGS. 28 and 29 in the same manner.

Figure 29:
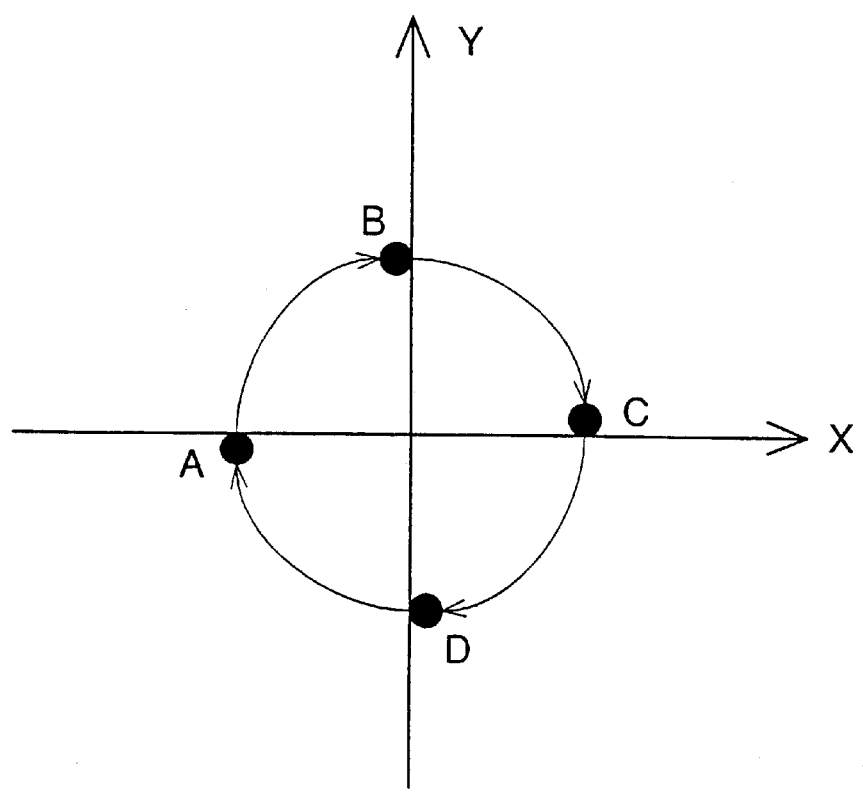
FIG. 29 is an XY table diagram showing a direction of an oscillation of the light emitted from the phase difference board according to the present invention.

When a time further passes as shown in FIG. 29, the light advances from a point C (1, 0) to a point D (0, −1) in the same manner. Therefore, the light passing through the ¼ λ plate 112 is converted from linear polarized light into circular polarized light as shown in FIGS. 27 and 29.

Figure 27:
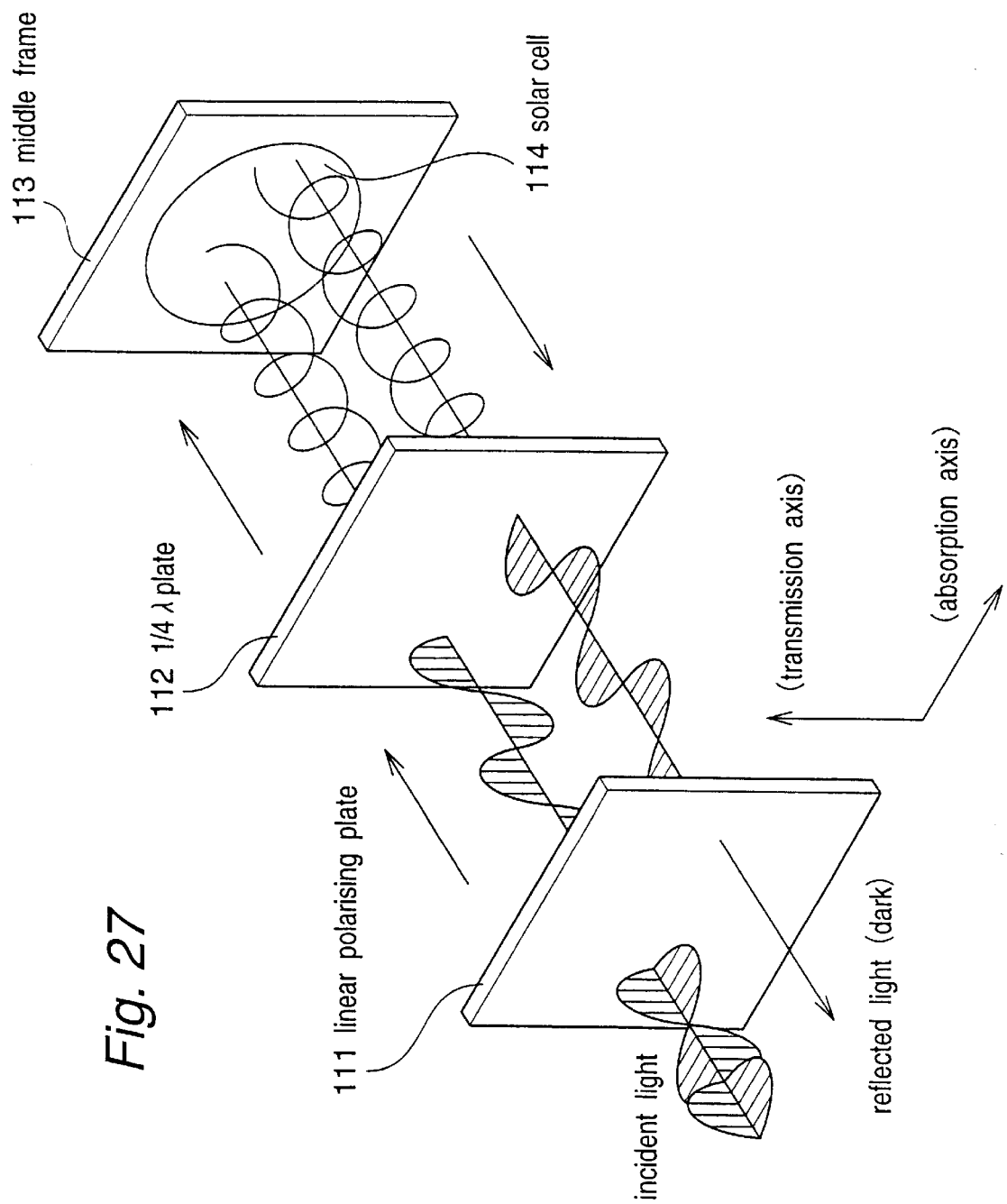
FIG. 27 is a perspective view showing the principle of an operation according to the present invention.
Figure 28:
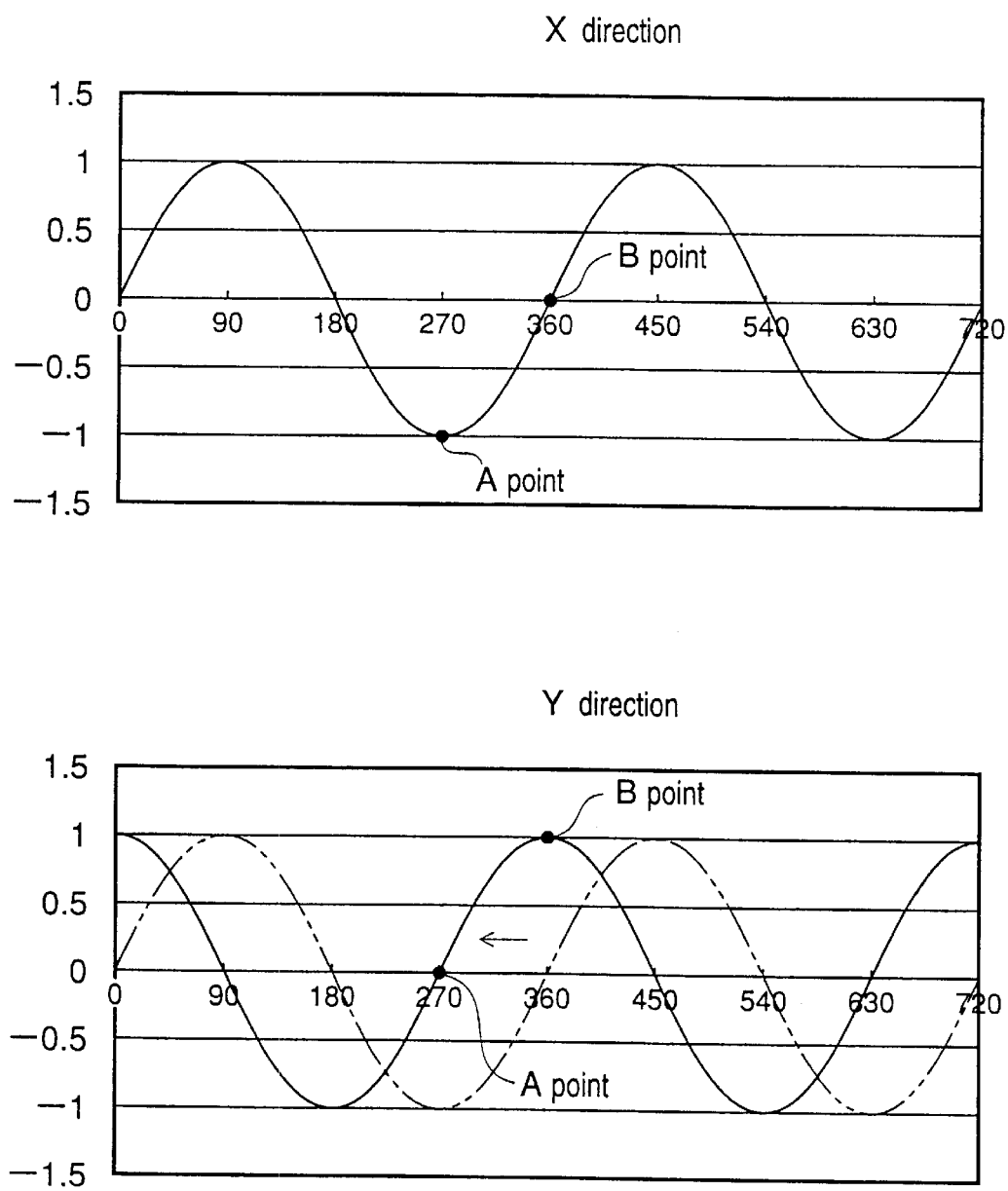
FIG. 28 is a chart in which light emitted from a phase difference board is divided into x and y directions according to the present invention.

The light thus circularly polarized is reflected by the surfaces of a middle frame 113 and a solar cell 114, and is incident on the ¼λ plate 112 again reversely to a direction of advance as shown in FIG. 27. In the same manner as described above, the light is converted into light having an oscillation plane in a direction perpendicular to the direction of incidence on the ¼ λ plate 112 and the light thus obtained is vertical to the transmission axis of the linear polarizing plate 111. Therefore, the light cannot pass through the linear polarizing plate 111 so that reflected light is blocked.

The linear polarizing plate 111 and the ¼ λ plate. 112 are combined to constitute a circular polarizing plate.

In this case, it has been known that the incident light is reflected by approximately several % per boundary surface if the boundary surfaces having different refractive indices are generally present. In the case of air and a glass, the incident light is reflected by approximately 4%. Therefore, it is preferable that the number of boundary surfaces should be decreased as greatly as possible. Accordingly, it is preferable that the linear polarizing plate 111 and the ¼ λ plate 112 should be stacked in a close contact state or should be bonded with an adhesive or a glue.

While the linear polarizing plate 111, the ¼ λ plate 112 and the middle frame 113 are square-shaped and the solar cell 114 is circular in FIG. 27, various other shapes may be used corresponding to design.

First Embodiment

The explanation of function of circular polarizing has been completed and a first embodiment will be described below in detail with reference to FIG. 1.

As shown in FIG. 1, a watch having a solar cell comprises a solar cell 13 electrically connected to a module 14, and a minute hand 17 and an hour hand 16 which are fixed to a central shaft 15. A circular polarizing plate A including a linear polarizing plate 11 and a ¼ λ plate 12 is provided between the hands 16 and 17 and the solar cell 13.

With such a structure, a solar cell element dividing line of the solar cell 13 cannot be seen through the circular polarizing plate constituted by the linear polarizing plate 11 and the ¼ λ plate 12. Moreover, since reflected light is eliminated, the color of the surface of the linear polarizing plate 11 is deepened so that a feeling of high quality can be obtained as goods.

In the present embodiment, marking such as a numeral is directly given to the linear polarizing plate 11 by means of printing to provide a function as a solar display board.

Moreover, it is desirable that the circular polarizing plate A constituted by the linear polarizing plate 11 and the ¼ λ plate 12 should have a plane direction positioned by an outer case which is not shown in respect of a watch assembling work. In the following embodiments, since effects are not affected, the description of the minute and hour hands will be omitted if there is no special condition.

In the same manner as in the following embodiments, while components are shown to be separated from each other for convenience of description in the drawings, they are actually incorporated in a close contact state, for example, properly in a state of adhesion, bonding and welding with an adhesive, a glue or the like.

Second Embodiment

Figure 2:
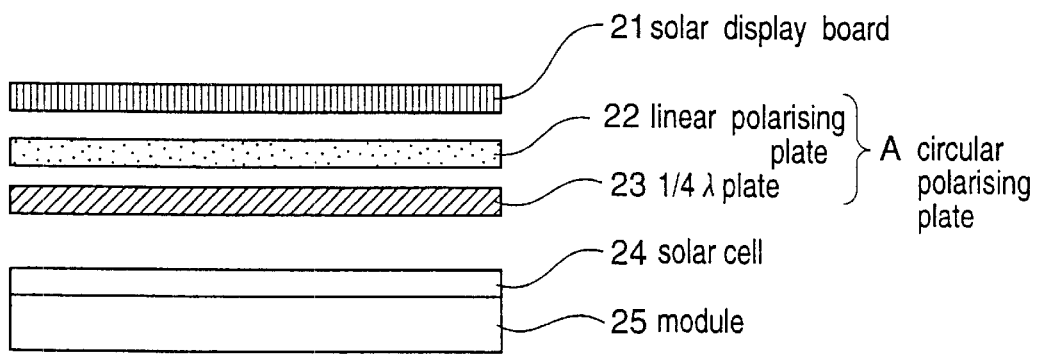
FIG. 2 is a schematic sectional view showing the inside of a watch case according to a second embodiment of the present invention.

As shown in FIG. 2, a circular polarizing plate A including a linear polarizing plate 22 and a ¼ λ plate 23 is provided between a solar cell 24 and a solar display board 21 having a light transmittance.

Consequently, a solar cell element dividing line of the solar cell 24 cannot be seen through the solar display board 21 so that a variation in design of the solar display board 21 is increased. Furthermore, the color of the solar display board 21 is deepened so that a feeling of high quality can be obtained as goods.

In a work for assembling a watch, first of all, a module 25 is fabricated and the external shapes of the solar display hoard 21, the solar cell 24, the linear polarizing plate 22 and the ¼ λ plate 23 are simultaneously processed through press molding or the like and they are superposed with a structure shown in FIG. 2 in an outer case which is not shown so that a finished watch is obtained. Accordingly, it is desirable that the circular polarizing plate constituted by the solar display board 21, the solar cell 24, the linear polarizing plate 22 and the ¼ λ plate 23 should have the same external shapes.

Third Embodiment

Figure 3:
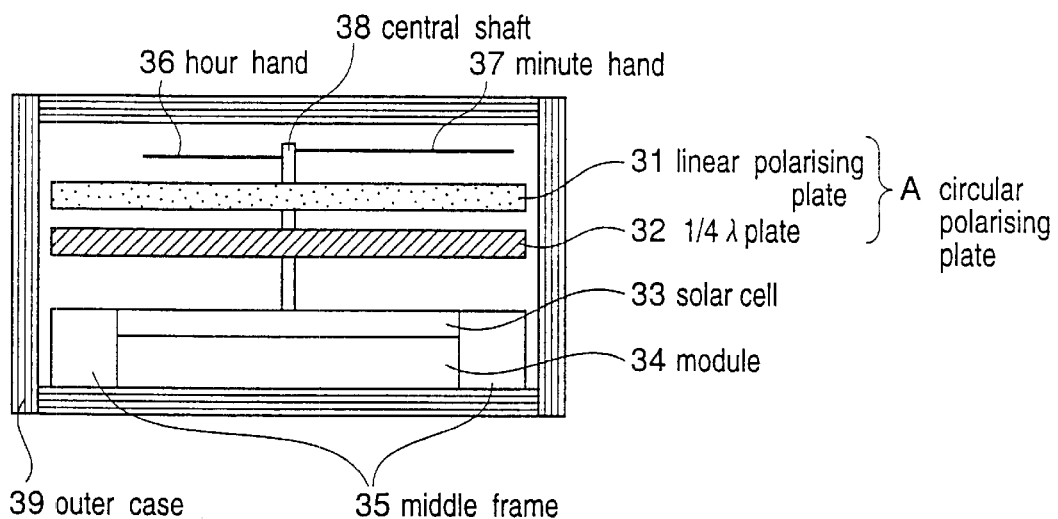
FIG. 3 is a schematic sectional view showing the inside of a watch case according to a third embodiment of the present invention.

In the present embodiment, FIG. 3 shows a structure of a watch in which a module 34 having a solar cell 33 is fixed into an outer case 39 through a middle frame 35.

A circular polarizing plate A constituted by a linear polarizing plate 31 and a ¼ λ plate 32 is provided above the middle frame 35 between a minute hand 37 and an hour hand 36 which are fixed to a central shaft 38 and the solar cell 33.

By such a structure, a boundary line between the solar cell 33 and the middle frame 35, a gate track generated through injection molding of the middle frame 35, and furthermore, a solar cell element dividing line of the solar cell 33 cannot be seen through the circular polarizing plate A constituted by the linear polarizing plate 31 and the ¼λ plate 32.

Moreover, it is desirable that the circular polarizing plate A should be provided to cover the solar cell 33 and the middle frame 35 as shown.

Since reflected light is eliminated, the color of the surface of the linear polarizing plate 31 is deepened so that a feeling of high quality can be obtained as goods. In the present embodiment, marking such as a numeral is directly given to the linear polarizing plate 31 by means of printing to provide a function as a solar display board. Moreover, the middle frame 35 is provided. Therefore, various external shapes of the watch can be obtained in respect of design. In the following embodiments, since effects are not affected, the description of the outer case will be omitted.

Fourth Embodiment

Figure 4:
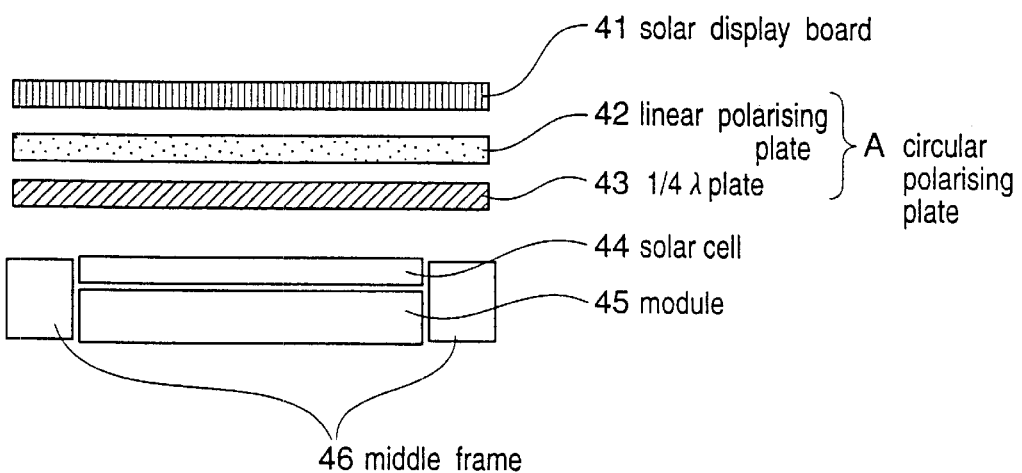
FIG. 4 is a schematic sectional view showing the inside of a watch case according to a fourth embodiment of the present invention.

Also in the present embodiment, FIG. 4 shows a structure of a watch in which a module 45 having a solar cell 44 is fixed through a middle frame 46 into an outer case which is not shown.

In the present embodiment, a circular polarizing plate A constituted by a linear polarizing plate 42 and a ¼ λ plate 43 is provided between the middle frame 46 and a solar display board 41.

By such a structure, a boundary line between the solar cell 44 and the middle frame 46, a gate track generated through injection molding of the middle frame 46, and furthermore, a solar cell element dividing line of the solar cell 44 cannot be seen through the solar display board 41 so that a variation in design of the solar display board 41 can be increased. Furthermore, the color of the solar display board 41 is deepened so that a feeling of high quality can be obtained as goods. Moreover, the middle frame 46 is provided. Therefore, various external shapes of the watch can be obtained in respect of design.

In the present embodiment, furthermore, a color display board including a dye, a pigment and the like is used for the solar display board 41, for example. There fore, although a tone has only a black color in the third embodiment, the display board can have colors. Thus, it is apparent that practical use can be enhanced considerably in respect of the design.

Moreover, it is desirable that the circular polarizing plate A constituted by the linear polarizing plate 42 and the ¼ λ plate 43, the middle frame 46 and the solar display board 41 should have the same external shapes in respect of an assembling work.

Fifth Embodiment

Figure 5:
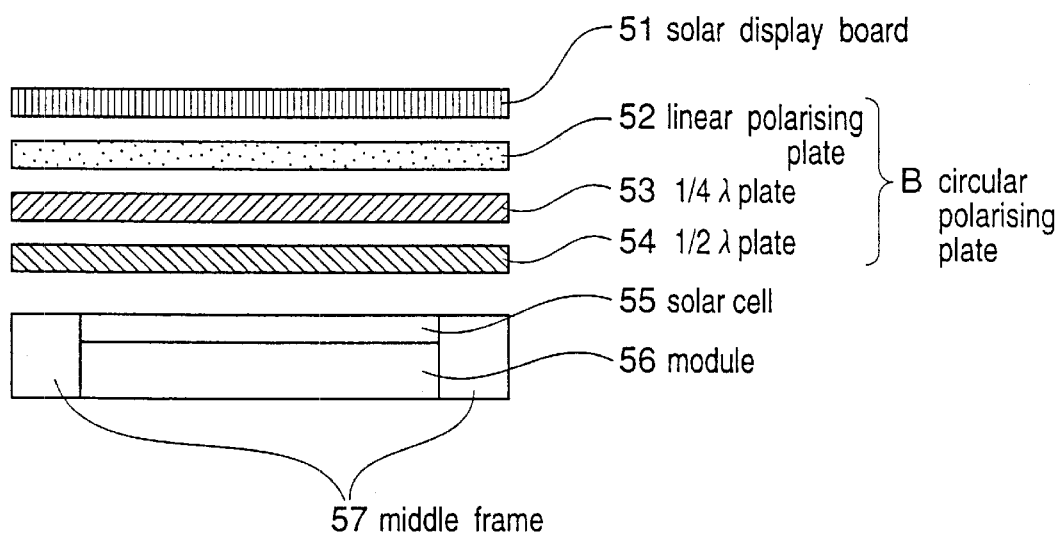
FIG. 5 is a schematic sectional view showing the inside of a watch case according to a fifth embodiment of the present invention.

Also in the present embodiment, FIG. 5 shows a structure of a watch in which a module 56 having a solar cell 55 is fixed through a middle frame 57 into an outer case which is not shown.

In the present embodiment, a circular polarizing plate B having a linear polarizing plate 52, a ¼ λ plate 53 and a ½ λ plate 54 stacked is used. The circular polarizing plate B is provided between the middle frame 57 and a solar display board 51.

With such a structure, the same effects as those in the fourth embodiment can be obtained. It has been known that the provision of the ½ λ plate 54 can enlarge a wavelength region in which light can be blocked and a wideband type circular polarizing plate can be obtained. In the same manner as the ¼ λ plate, the ½ λ plate includes a delay axis and has the function of delaying light incident in that direction by ½ λ.

Sixth Embodiment

Figure 6:
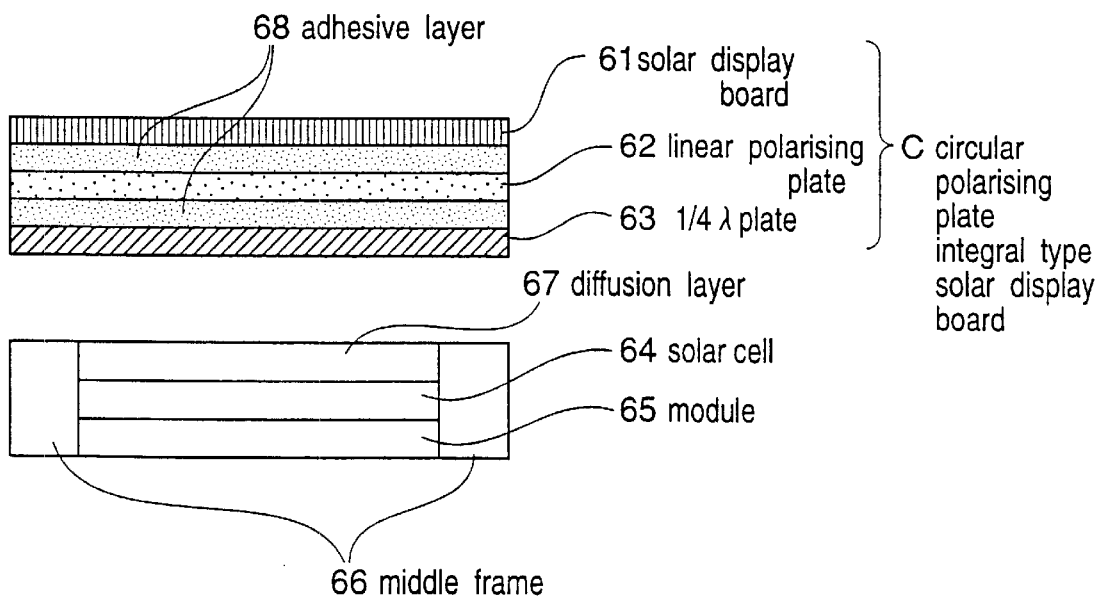
FIG. 6 is a schematic sectional view showing the inside of a watch case according to a sixth embodiment of the present invention.

As shown in FIG. 6, a solar display board 61, a linear polarizing plate 62 and a ¼ λ plate 63 are bonded through an adhesive layer 68 and are then pressurized and molded. Thus, a circular polarizing plate integral type solar display board C is fabricated.

The circular polarizing plate integral type solar display board C is provided above a solar cell 64 having a diffusion layer 67 preformed on an upper surface thereof.

Also in this case, similarly, a boundary line between the solar cell 64 and a middle frame 66, a gate track generated through injection molding of the middle frame 66, and furthermore, a solar cell element dividing line of the solar cell 64 cannot be seen through the solar display board 61. As a result, a variation in design of the solar display board 61 can be increased. Furthermore, the color of the solar display board 61 is deepened so that a feeling of high quality can be obtained as goods. Moreover, the middle frame 66 is provided. Therefore, various external shapes of the watch can be obtained in respect of design In general, it has been known that incident light is reflected by approximately several % for each of boundary surfaces having different refractive indices. In the case of air and a glass, the incident light is reflected by approximately 4%. Therefore, it is preferable that the number of boundary surfaces should be decreased as greatly as possible. By application to the present embodiment, when two film materials, that is, the linear polarizing plate 62 and the ¼ λ plate 63 are inserted between the solar display board 61 and the solar cell 64 having the diffusion layer 67 formed thereon, the number of boundary surfaces is increased through the insertion of the films so that light transmitted to the solar cell 64 is decreased.

However, when the solar display board 61 and the linear polarizing plate 62, and the linear polarizing plate 62 and the ¼ λ plate 63 are bonded through an adhesive layer 68 respectively as in the present embodiment, the number of boundary surfaces is decreased from 7 to 3. As a result, the light transmitted to the solar cell 64 can be more enhanced and a power generation efficiency can be more improved as compared with the case in which the adhesive layer 68 is not provided.

In order to carry out accommodation in an outer case which is not shown, moreover, an external shape processing is required and a perforation processing for penetrating with a central shaft which is not shown is also required. If three layers are bonded by adhesive layers, the processing is carried out only once so that the steps can be simplified and a cost can be reduced. As compared with the case in which the three layers are processed separately, furthermore, it is possible to prevent a shift when the three layers are bonded. Consequently, the quality of design can also be enhanced.

Furthermore, referring to a work for assembling a watch according to the present embodiment, the diffusion layer 67 is first formed on the surface of the solar cell 64, is bonded to a module 65 and is then fitted in the middle frame 66. At the same time, the solar display board 61, the linear polarizing plate 62 and the ¼ λ plate 63 are bonded together through the adhesive layer 68, and the external shape and perforation processings are then carried out through a press or the like. As shown, subsequently, they are superposed on an outer case which is not shown. Thus, a finished watch is obtained.

In the present embodiment, since the solar display board 61, the linear polarizing plate 62 and the ¼ λ plate 63 are bonded through the adhesive layer 68, they can be treated as one member. Thus, the work for assembling a watch can be carried out most easily in the embodiments.

Seventh Embodiment

Figure 7:
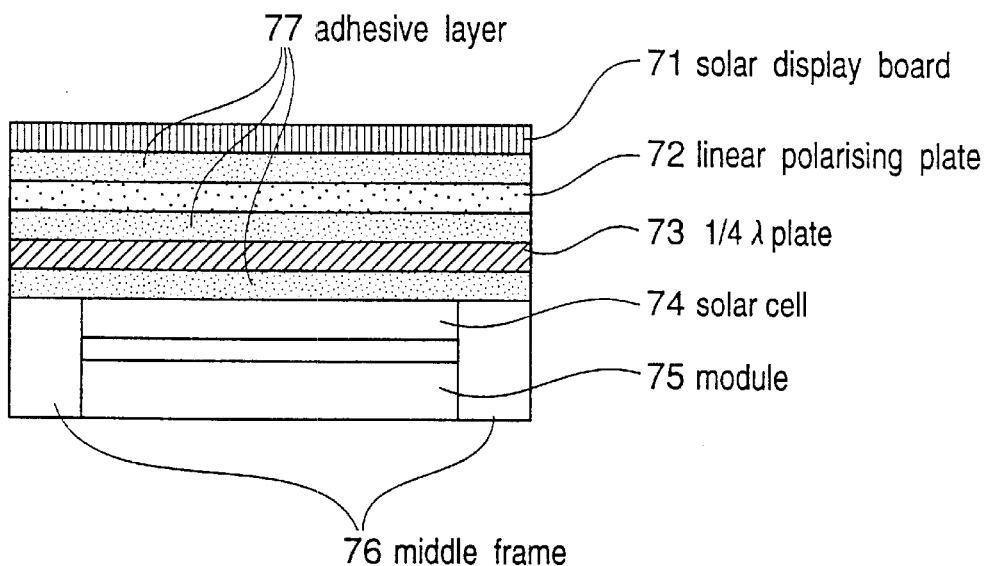
FIG. 7 is a schematic sectional view showing the inside of a watch case according to a seventh embodiment of the present invention.
Figure 8:
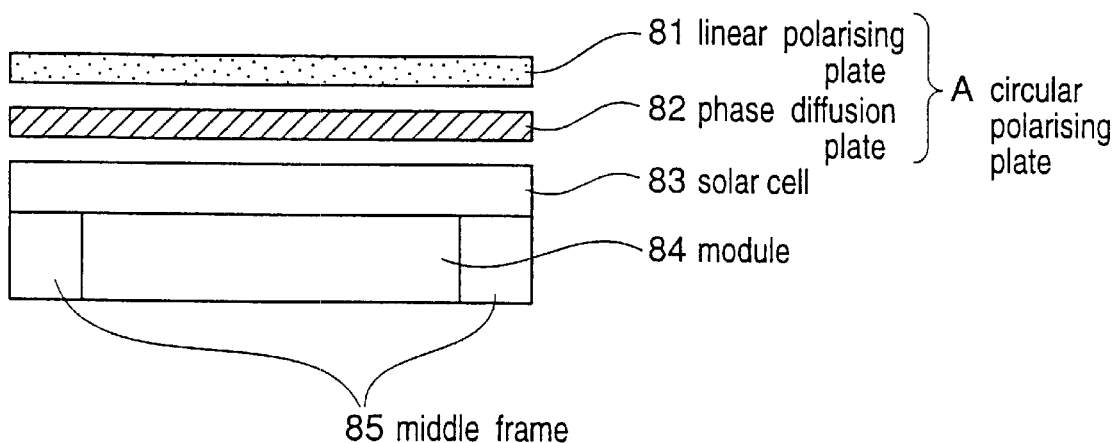
FIG. 8 is a schematic sectional view showing the inside of a watch case according to an eighth embodiment of the present invention.
Figure 9A:
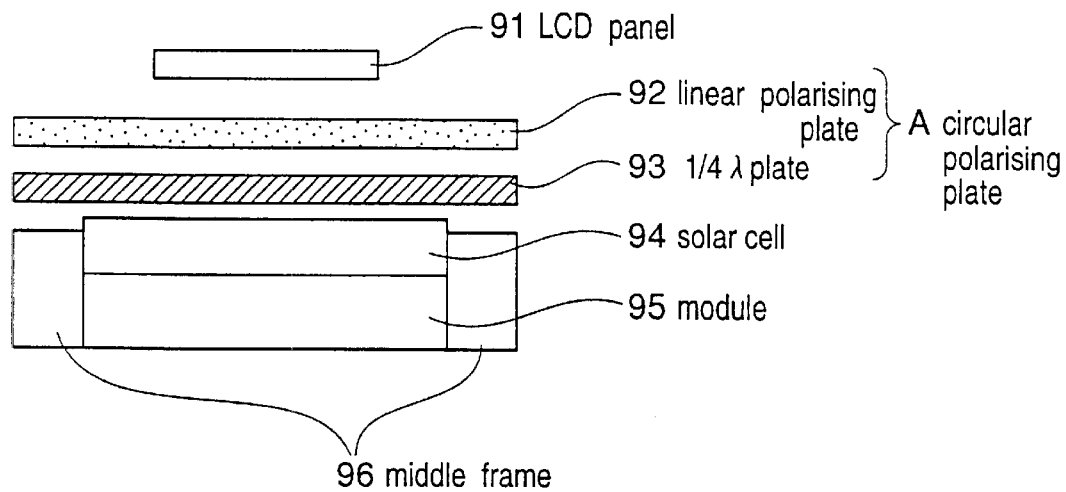
FIG. 9 shows the inside of a watch case according to a ninth embodiment of the present invention, FIG. 9(a) being a schematic sectional view showing the inside of the watch case and FIG. 9(b) being a front view showing the inside of the watch case seen from above.
Figure 9B:
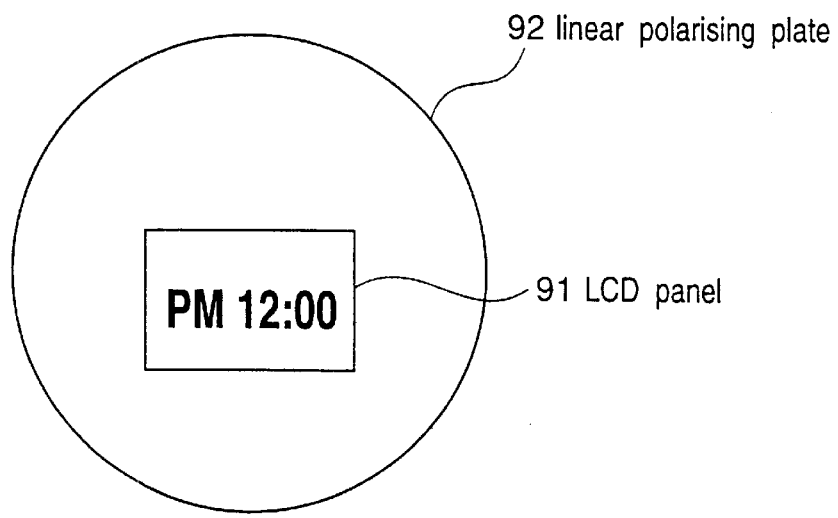

As shown in FIG. 7, a solar display board 71, a linear polarizing plate 72, a ¼ λ plate 73, a solar cell 74 and a middle frame 76 are stacked as shown and are bonded with an adhesive layer 77.

Also in this case, in the same manner as in the sixth embodiment, a boundary line between the solar cell 74 and the middle frame 76, agate track generated through injection molding of the middle frame 76, and furthermore, a solar cell element dividing line of the solar cell 74 cannot be seen through the solar display board 71 so that a variation in design of the solar display board 71 can be increased.

Furthermore, the color of the solar display board 71 is deepened so that a feeling of high quality can be obtained as goods.

Moreover, the middle frame 76 is provided. Therefore, various external shapes of the watch can be obtained in respect of the design.

Also in the present embodiment, in the same manner as in the sixth embodiment, the number of boundary surfaces provided between the solar display board 71 and the air is one and a transmittance can be more enhanced than that in the sixth embodiment and a power generation efficiency can also be improved.

Eighth Embodiment

In the present embodiment, a solar cell 83 is larger than the external shape of a module 84 and the external shape of a middle frame 85 for fixing the module 84 to an outer case which is not shown is equal to that of the solar cell 83.

In the present embodiment, the solar cell 83 wholly covers a boundary line between the middle frame 85 and the module 84 and a gate track generated through injection molding of the middle frame 85. Therefore, the quality of display is not reduced. By inserting a linear polarizing plate 81 and a ¼ λ plate, a solar cell element dividing line of the solar cell 83 can be prevented from being seen.

Ninth Embodiment

The present embodiment provides a watch structure in which a solar cell 94 and a module 95 are fixed through a middle frame 96 to an outer case which is not shown.

Then, a circular polarizing plate A constituted by a linear polarizing plate 92 and a ¼ λ plate 93 is provided above the middle frame 96. Furthermore, an LCD panel 91 is provided thereabove.

The LCD panel 91 having a smaller external shape than that of the solar cell 94 is provided above the circular polarizing plate A. Consequently, light transmitted through the linear polarizing plate 92 and the ¼ λ plate 93 reaches the solar cell 94, and power is supplied to the LCD panel to display a time by electromotive force of the solar cell 94.

Also in the present embodiment, in the same manner as in the seventh embodiment, a boundary line between the solar cell 94 and the middle frame 96, a gate track generated through injection molding of the middle frame 96, and furthermore, a solar cell element dividing line of the solar cell 94 cannot be seen so that a variation in design can be increased and a feeling of high quality can be obtained as goods in the present embodiment, the LCD panel displays a time of 12 o'clock in the afternoon.

Tenth Embodiment

A linear polarizing plate has an absorption type and a reflection type In the present embodiment, a reflection type linear polarizing plate having a reflection axis orthogonal to a transmission axis is used.

Figure 10:
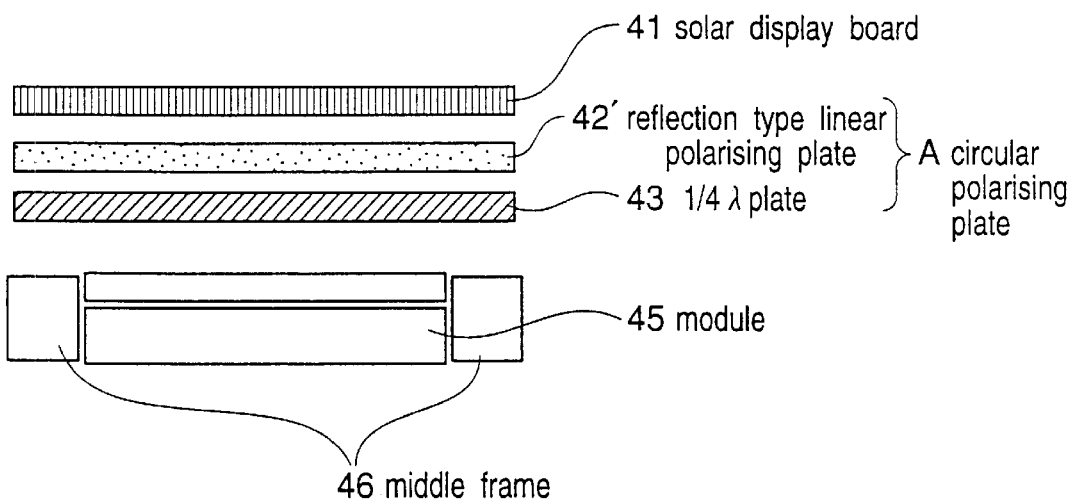
FIG. 10 is a schematic sectional view showing the inside of a watch case according to a tenth embodiment of the present invention.

In the case where a circular polarizing plate is constituted by the reflection type linear polarizing plate and a ¼ λ plate and is inserted between a solar display board and a solar cell, a reflection type linear polarizing plate 42' is used as a linear polarizing plate 42 as in another embodiment, for example, as shown in FIG. 10. In this case, also, a boundary line between a solar cell 44 and a middle frame 46, a gate track generated through injection molding of a middle frame 46, and furthermore, a solar cell element dividing line of a solar cell 44 cannot be seen through a solar display board 41. As a result, a variation in design of the solar display board 41 can be increased in the same manner as in the fourth embodiment.

In the case of a blue solar display board, a brightness is decreased and the blue color of the solar display board is deepened by using the absorption type linear polarizing plate and the blue color of the solar display board is reproduced faithfully by using the reflection type linear polarizing plate. In the case of a black solar display board, moreover, a brightness is also decreased and a feeling of high quality can be obtained by using the absorption type linear plate and a brightness of the black color of the solar display board is increased to approximate a gray color by using the reflection type linear polarizing plate.

As described above, the color of the solar display board is changed in a deeper direction by using the absorption type linear polarizing plate, and a feeling of high quality can be obtained visually irrespective of the color of the solar display board. The absorption type is different from the reflection type in that an oscillation in a direction perpendicular to the transmission axis of the linear polarizing plate is absorbed in the linear polarizing plate or is reflected from the surface of the linear polarizing plate. Therefore, they carry out the same actions for transmitted light and have the same functions as the circular polarizing plates.

Eleventh Embodiment

Figure 11:
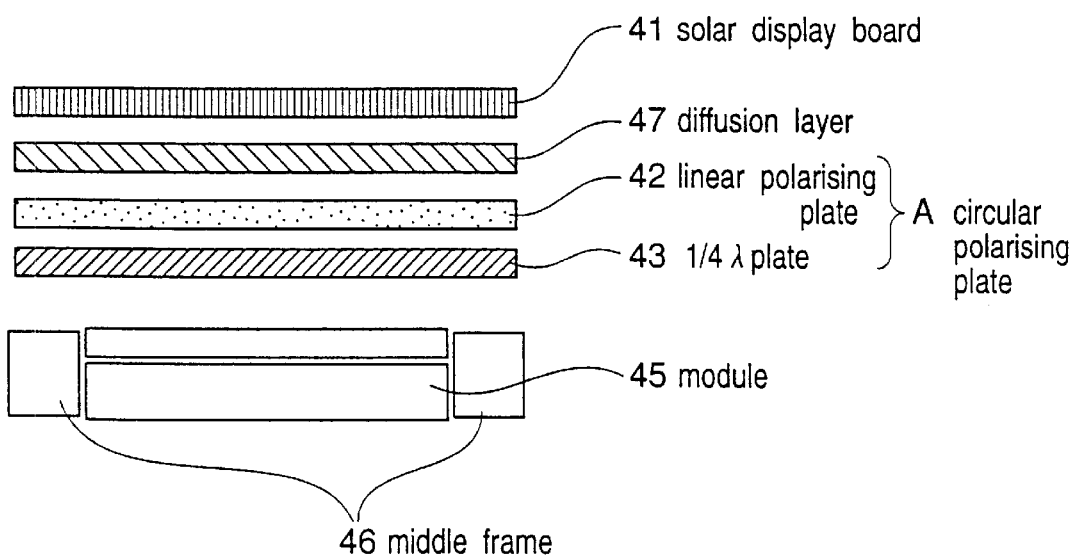
FIG. 11 is a schematic sectional view showing the inside of a watch case according to an eleventh embodiment of the present invention.

As shown in FIG. 11, a diffusion layer 47 is formed between the solar display board 41 and the linear polarizing plate 42 in the structure of FIG. 4.

By such a structure, a boundary line between the solar cell 44 and the middle frame 46, a gate track generated through injection molding of the middle frame 46, and furthermore, a solar cell element dividing line of the solar cell 44 cannot be seen more than those in the fourth embodiment so that a variation in design of the solar display board 41 can be increased.

Furthermore, the color of the solar display board 41 is deepened and a feeling of high quality can be obtained as goods. Moreover, the middle frame is provided. Therefore, various external shapes of a watch can be obtained in respect of the design.

In the present embodiment, when the solar display board 41 is subjected to injection molding, concavo-convex shapes previously formed in a mold are transferred on to a surface opposed to the linear polarizing plate 42 of the solar display board 41 so that a diffusion layer is formed.

As described in the Background of the invention, the simple formation of the diffusion layer is not sufficient. By thus using a circular polarizing plate together, the above-mentioned effects can be produced.

Twelfth Embodiment

Figure 12:
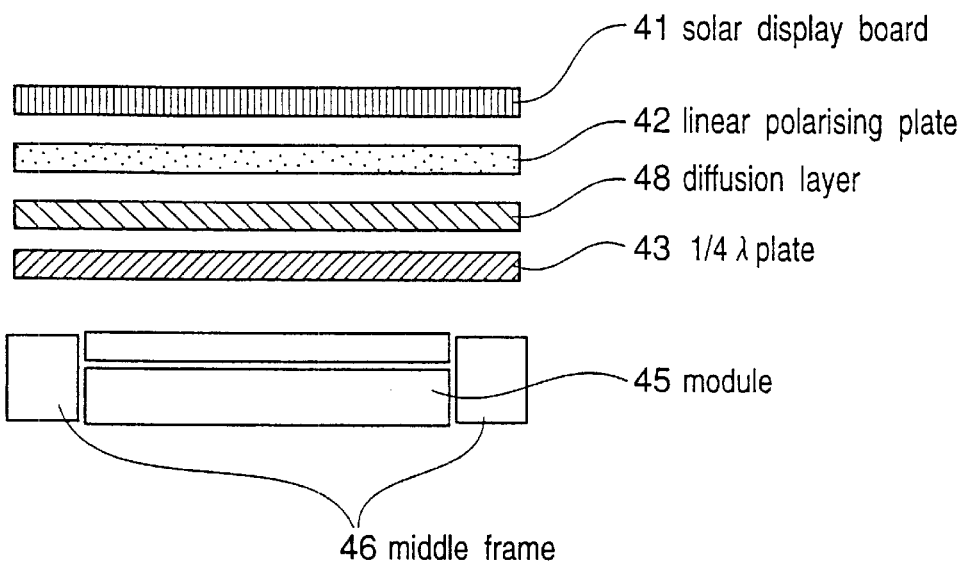
FIG. 12 is a schematic sectional view showing the inside of a watch case according to a twelfth embodiment of the present invention.

As shown in FIG. 12, a diffusion layer 48 is formed between the linear polarizing plate 42 and the ¼ λ plate 43 in the structure of FIG. 4.

Consequently, a boundary line between the solar cell 44 and the middle frame 46, a gate track generated through injection molding of the middle frame 46, and furthermore, a solar cell element dividing line of the solar cell 44 cannot be seen more than those in the fourth embodiment so that a variation in design of the solar display board 41 can further be increased.

Furthermore, the color of the solar display board 41 is deepened and a feeling of high quality can be obtained as goods. Moreover, the middle frame is provided. Therefore, various external shapes of a watch can be obtained in respect of the design.

In the present embodiment, oxide particulates are dispersed into an adhesive layer between the linear polarizing plate 42 and the ¼λ plate 43 so that the diffusion layer is formed.

Thirteenth Embodiment

Figure 13:
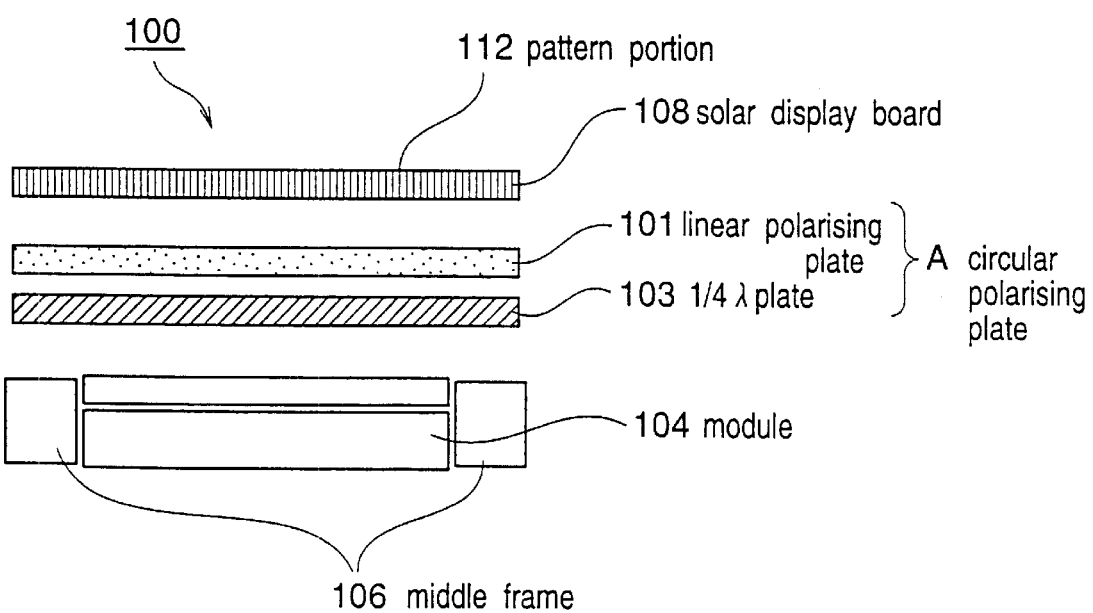
FIG. 13 is a schematic sectional view showing the inside of a watch case according to a thirteenth embodiment of the present invention.

As shown in FIG. 13, in a watch structure 100 according to the present embodiment, a solar cell 102 and a module 104 are fixed through a middle frame 106 to an outer case which is not shown.

A circular polarizing plate A constituted by a linear polarizing plate 101 and a ¼ λ plate 103 is provided above the middle frame 106. Furthermore, a solar display board 108 is provided thereabove.

Figure 14:
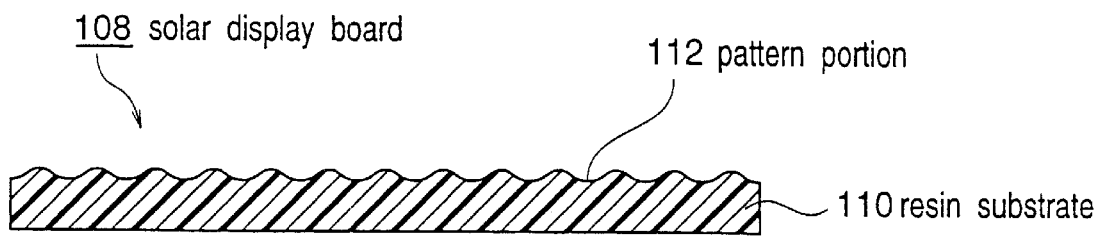
FIG. 14 is a partially enlarged sectional view showing a solar display board according to the thirteenth embodiment of the present invention.

As shown in FIG. 14, the solar display board 108 is constituted by a resin substrate body 110 and a pattern portion 112 formed on an upper surface thereof.

It is preferable that the resin substrate 110 should be formed of a thermoplastic resin, and furthermore, a resin selected from the group consisting of polyvinyl chloride, an acryl resin and polycarbonate. In the present invention, it is particularly preferable that the acryl resin or the polycarbonate should be used. A thickness of the resin substrate 110 is preferably approximately 50 to 500 $\mu$m, and more preferably approximately 80 to 200 $\mu$m. The resin substrate 11 may be transparent or be colored and translucent.

A pattern is given to the resin substrate 110 by an injection molding method for injection molding a resin in a mold having a pattern formed thereon (which will be hereinafter referred to as a "pattern mold"); a pattern transfer method for transferring a pattern onto a resin substrate through a thermal press using the pattern mold; or a machining method using engraving, rubbing or the like. In the present invention, particularly, the pattern transfer method is preferably employed.

As a method of giving a pattern to the resin substrate 110, the pattern transfer method will be described below.

Figure 15A:
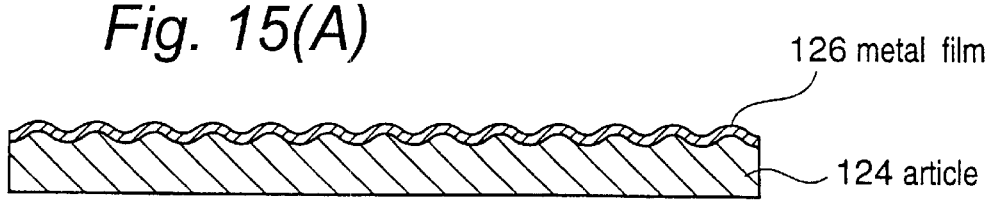
FIGS. 15(A)–15(C) are schematic views showing the steps of a method of manufacturing a resin substrate having a pattern according to the present invention.
Figure 15B:
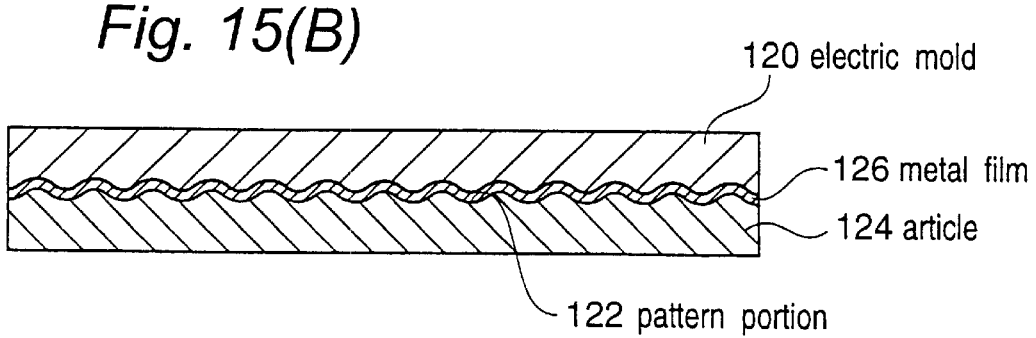
Figure 15C:
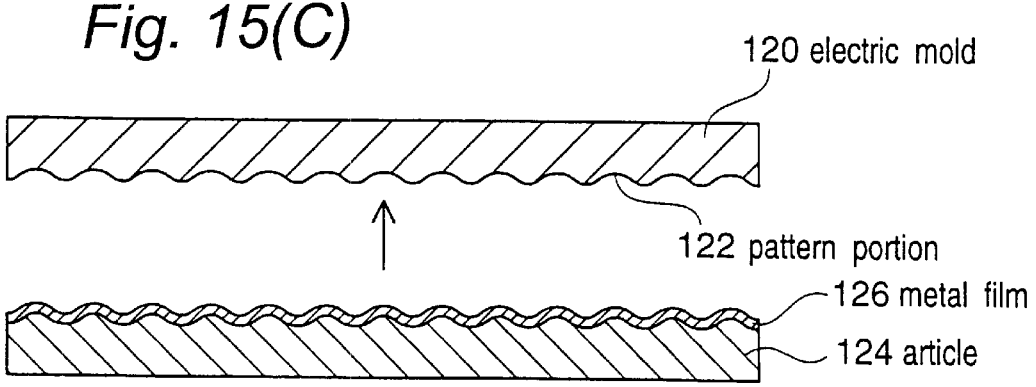

As shown in FIGS. 15(A) to 15(C), the pattern transfer method comprises the steps of manufacturing an electric mold 120 having a pattern surface and of thermally pressing a pattern surface 122 molded in the electric mold 120 against the resin substrate 110.

When the electric mold 120 having the pattern surface is to be manufactured, a surface pattern of an article 124 having a pattern is first molded through an electric molding method. More specifically, the article 124 having the pattern is subjected to electroforming. In the case in which the article 124 does not have a conductivity, a metal film 126 is formed on the surface of the article 124 to give a conductivity to the article 124.

Examples of the article 124 having the pattern include a cloth, a paper, a rift, a grain, a pyroxene, a leaf, a petal, a shell, a leather, artificial substances having various fine patterns (an artificial leather, engraving, chasing) and the like. It is preferable that the cloth, the paper, the rift, the grain, the pyroxene, the leaf, the engraving and the chasing should be used.

As shown in FIG. 15(A), a pattern is formed on the surface of the article 124 (concavo-convex portions on the surface in FIG. 15(A)). In FIG. 2, the back face of the article 124 is omitted.

In order to give a conductivity to the surface of the article 124, the surface of the article 124 is first cleaned and a metal film 126 is then formed on the surface of the article 124. The metal film 126 is formed by vacuum evaporation, ion plating, sputtering, nonelectrolytic plating, silver mirror reaction or the like, for example. While the metal film 126 is formed of a metal such as silver or gold or their alloy and a thickness thereof is not particularly restricted, a thickness of approximately 1 to 30 $\mu$m, preferably approximately 1 to 10 $\mu$m is suitable.

In the case in which the article 124 has a conductivity as described above, it is not necessary to form the metal film 126.

Next, the surface of the metal film 126 is subjected to removal if necessary. When the article 124 has a conductivity, the surface of the article 124 is directly subjected to the removal.

The removal can be carried out through injection of selenious acid. When the removal is carried out, the electric mold 120 can easily be removed.

As shown in FIG. 15(B), next, a metal is deposited on the surface of the article 124 or the surface of the metal film 126 through the electric molding (electroforming) to form the electric mold 120.

As a material of the electric mold 120, a metal such as nickel, copper or iron or their alloy is preferably used.

A thickness of the electric mold 120 is 100 to 300 $\mu$m, preferably 100 to 250 $\mu$m, and more preferably 100 to 200 $\mu$m. If the thickness of the electric mold 120 is set in such a range, the resin substrate 110 is not deformed and heat transfer can be carried out well during a thermal press.

The conditions of the electric molding are not particularly restricted but are properly selected from conventional electric molding (plating) conditions. There will be briefly described the electric molding conditions for obtaining the electric mold 120 having a thickness of 200 $\mu$m by using a nickel metal. However, the conditions should not be restricted by such a condition.

As a pretreatment, the surface of the article 124 having a pattern or the metal film 126 is subjected to treatments of electrolytic degreasing, washing, acid neutralization, washing, removal (potassium dichromate) and washing.

Next, the electroforming is carried out at 265 AH (IA/dm$^2$) at a liquid temperature of 50° C. by using a nickel plating bath (450 g/liter of nickel sulfamate, 40 g/liter of boric acid). Consequently, the electric mold 120 having a thickness of 200 $\mu$m is obtained.

As shown in FIG. 15(C), next, the electric mold 120 is removed from the surface of the article 124 or the surface of the metal film 126. Consequently, the electric mold 120 having a molded pattern surface is obtained. The electric mold 120 thus obtained is cut out corresponding to the shape of a display board to be intended if necessary.

Figure 16:
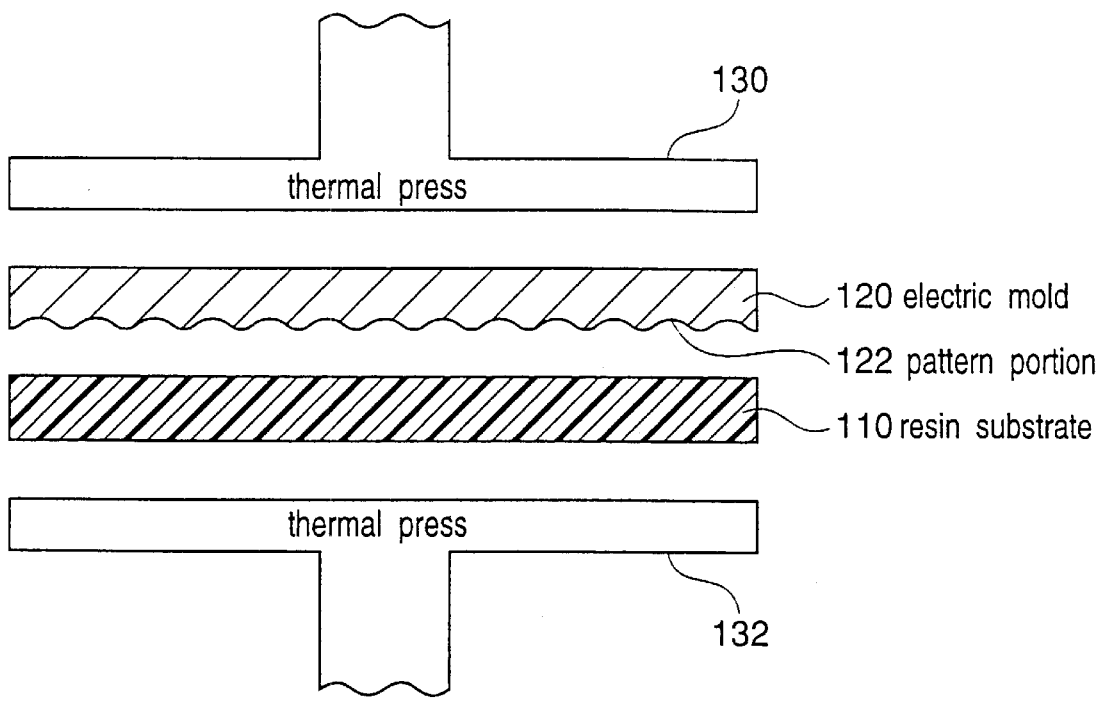
FIG. 16 is a schematic view showing a method of forming the resin substrate having a pattern through a thermal press according to the present invention.

As shown in FIG. 16, subsequently, the molded pattern is transferred onto the resin substrate 110.

In order to transfer the pattern onto the resin substrate 110, the molded pattern surface of the electric mold 12 opposed to the resin substrate 110 and are thermally pressed between a pair of upper and lower thermal presses 130 and 132.

While the conditions of the thermal press are varied depending on the material and thickness of the resin substrate 110, a thermal press temperature is generally set in the vicinity of a melting temperature of a resin, specifically, approximately 90 to 180° C. is suitable. In particular, it is preferable that a temperature on the electric mold side should be set to 120 to 140° C. and a temperature of a resin substrate should be set to approximately 40 to 80° C. in a thermal press machine. A thermal press pressure is suitably set to approximately 20 to 100 kb/cm$^2$. Moreover, it is preferable that the time required for the thermal press should be set to approximately 10 to 180 seconds.

Prior to the thermal press of the resin substrate 110, preheating is carried out so that the time required for the thermal press can be shortened and productivity can be enhanced. It is preferable that a preheating temperature should be set to approximately 40 to 80° C. If such a preheating treatment is carried out, the time required for the thermal press can be shortened to approximately 10 to 30 seconds.

Moreover, the electric mold 120 may be bonded to a thermal press head during the thermal press. Consequently, the resin substrate 110 and the electric mold 120 can easily be removed from each other after the thermal press so that the productivity can be enhanced.

By the thermal press, the molded pattern 122 of the electric mold 120 is transferred onto the resin substrate 110 and the electric mold 120 is removed. Consequently, the resin substrate 110 having a pattern can be obtained.

Furthermore, it is also possible to manufacture a transparent resin film having a pattern on both surfaces by thermally pressing the pattern surface of the electric mold 120 against both surfaces of the resin substrate 110 at the same time or successively.

In the case in which the thermal press is to be carried out over both surfaces at the same time, it is preferable that the electric mold 120 should be fixed to the upper and lower thermal press heads. In the case in which the thermal press is to be successively carried out over both surfaces, moreover, it is preferable that the thermal press should be performed over one of the surfaces, the resin substrate 110 should be then turned over and the thermal press should be performed over the other surface.

The resin substrate 110 having a pattern is manufactured independently one by one in the method of manufacturing the resin substrate 110 having a pattern described above. However, it is also possible to obtain the resin substrate 110 having a pat tern by producing the electric mold 120 having a plurality of patterns, thermally pressing the electric mold 120 against a plastic film, producing the resin substrate 110 having a plurality of pattern portions and cutting out the shape of a display board for each pattern.

The resin substrate 110 having a pattern thus constituted is stacked in a close contact state over the upper surface of the circular polarizing plate A constituted by the linear polarizing plate 101 and the ¼ λ plate 103. Alternatively, the resin substrate 110 is integrated by means of bonding using an adhesive, bonding using a glue, film bonding, melting bonding, high frequency bonding or the like, for example.

A pattern may be transferred onto the resin substrate 110 before or after the bonding of the resin substrate 110 and the circular polarizing plate A.

Figure 17:
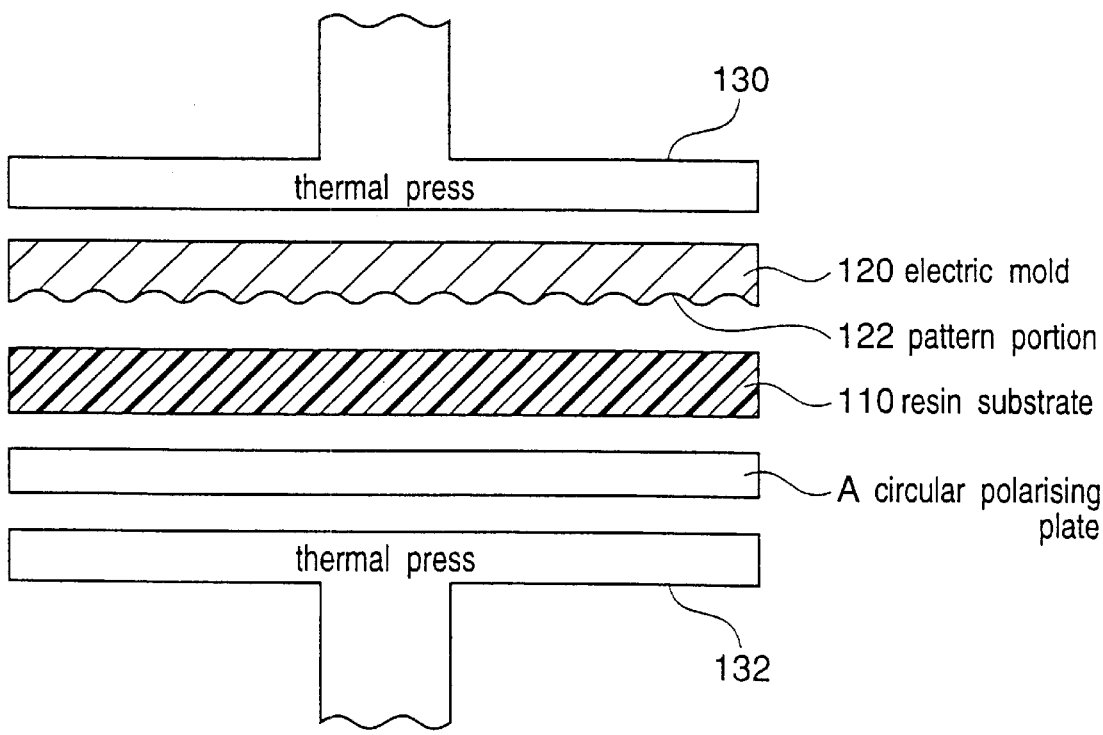
FIG. 17 is a schematic view showing another method of forming the resin substrate having a pattern through a thermal press according to the present invention.

After the molded pattern of the electric mold 120 is thus transferred onto the resin substrate 110 through the thermal press, the pattern transfer onto the resin substrate 110 and the integration with the circular polarizing plate A can also be carried out simultaneously by using the thermal press as shown in FIG. 17, instead of stacking the resin substrate 110 on the upper surface of the circular polarizing plate A constituted by the linear polarizing plate 101 and the ¼ λ plate 103 or integrating the resin substrate 110 there with.

More specifically, as shown in FIG. 17, the circular polarizing plate A constituted by the linear polarizing plate 101 and the ¼ λ plate 103, the resin substrate 110 and the electric mold 120 are provided between the pair of upper and lower thermal presses 130 and 132 in order. Thereafter, the pattern 122 of the electric mold 120 is transferred onto the upper surface of the resin substrate 110 by a thermal press at a time and the resin substrate 110 is welded and integrated with the circular polarizing plate A, through the heating of the thermal press.

In this case, it is desirable that an adhesive should be interposed between the resin substrate 110 and the circular polarizing plate A, because the integration can easily be carried out, which is not shown.

By such a method, the pattern 122 of the electric mold 120 is transferred onto the upper surface of the resin substrate 110 through the one-time thermal press and the resin substrate 110 is integrated with the circular polarizing plate A through the heating of the thermal press. Therefore, a working efficiency can be very enhanced.

With such a structure, a boundary line between the solar cell 102 and the middle frame 106, agate track generated through injection molding of the middle frame 106, and furthermore, a solar cell element dividing line of the solar cell 102 cannot be seen still more than those in the fourth embodiment. As a result, a variation in the design of the solar display board 108 can further be increased.

Furthermore, a cloth, a paper, a rift, a grain, a pyroxene, a leaf, a petal, a shell, a leather and various fine patterns to be the pattern portion 112 of the resin substrate 110 are transferred onto the upper surface of the solar display board 108. Consequently, a feeling of high quality of the solar display board 108 can be produced. In addition, it is possible to increase a variation in design in which a decorative property is great and the depth of a pattern and a three-dimensional effect are excellent. Thus, the feeling of high quality can be produced as goods. Moreover, the middle frame is provided. Therefore, various external shapes of the watch can be obtained in respect of the design.

Fourteenth Embodiment

Figure 18:
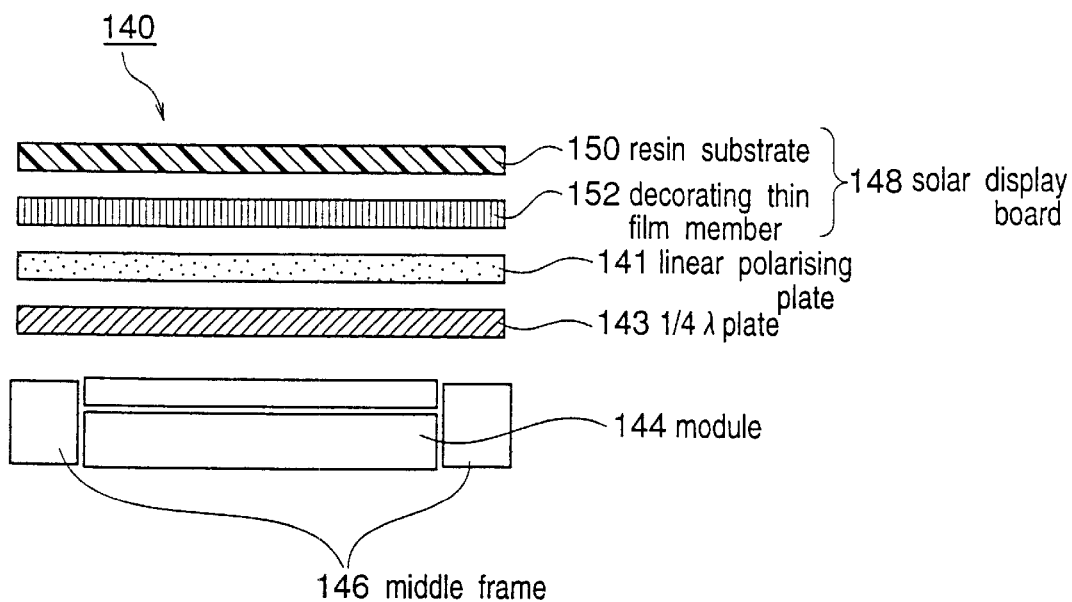

As shown in FIG. 18, in a watch structure 140 according to the present embodiment, a solar cell 142 and a module 144 are fixed through a middle frame 146 to an outer case which is not shown in the same manner as that in the thirteenth embodiment.

A circular polarizing plate A constituted by a linear polarizing plate 141 and a ¼ λ plate 143 is provided above the middle frame 146. Furthermore, a solar display board 148 is provided thereabove.

The solar display board 148 according to the present embodiment includes a resin substrate 150 having a pattern and a decorating thin film member 152.

Since the material and fabricating method for the resin substrate 150 having a pattern are the same as those in the thirteenth embodiment, detailed description thereof will be omitted.

The decorating thin film member 152 is not particularly restricted but may be any of various thin layer articles having a pattern, coloring or the like. Examples of the decorating thin film member 152 include a thin layer article formed of a natural material such as a cloth, a paper, a thinly sliced shell or a wood, a ceramic sheet, a polarizing film, a coloring film, an electroforming foil, an electrodeposited image, an etched metal foil (etched image), a film on which a hologram is printed out (a hologram image) and the like. The thickness of the decorating thin film member 152 is preferably approximately 5 to 300 μm, and more preferably approximately 10 to 200 μm.

The resin substrate 150 is bonded to the decorating thin film member 152 through, for example, adhesion using an adhesive, bonding using a glue, film bonding, melting bonding, high frequency bonding or the like.

In this case, the whole thickness of the display board 148 including the resin substrate 150 and the decorating thin film member 152 is not particularly restricted but is preferably 60 to 800 μm, and more preferably 300 to 500 μm.

The display board according to the present invention, moreover, it is desirable that a light transmittance (a visible light range or wavelength: 600 nm) should be 10% or more, preferably 20% or more, and more preferably 30% or more by proper selection of the material and the thickness. A display board having such a light transmittance can be preferably used as a clock dial of a solar charging driving type which has recently spread in the market. This is the same as in the following embodiments.

With such a structure, a boundary line between the solar cell 142 and the middle frame 146, a gate track generated through injection molding of the middle frame 146, and furthermore, a solar cell element dividing line of the solar cell 142 cannot be seen still more than those in the fourth embodiment. As a result, a variation in the design of the solar display board 148 can further be increased.

Furthermore, a decoration which is present on the upper surface of the solar display board 148 such as a cloth, a paper, a rift, a grain, a pyroxene, a leaf, a petal, a shell, a leather and various transferred fine patterns to be the pattern portion 152 of the resin substrate 150 and a decoration which is present thereunder, for example, a thin layer article formed of a natural material such as a cloth, a paper, a shell or a wood of the decorating thin film member 152, a polarizing film, a coloring film, an electroforming foil or an electrodeposited image produce a decorative property. Therefore, the design having a three-dimensional effect and a feeling of high quality can be implemented.

Consequently, the feeling of high quality of the solar display board 148 can be produced. In addition, it is possible to increase a variation in design in which a decorative property is great and the depth of a pattern and a three-dimensional effect are excellent. Thus, the feeling of high quality can be produced as goods. Moreover, the middle frame is provided. Therefore, various external shapes of the watch can be obtained in respect of the design.

Fifteenth Embodiment

Figure 19:
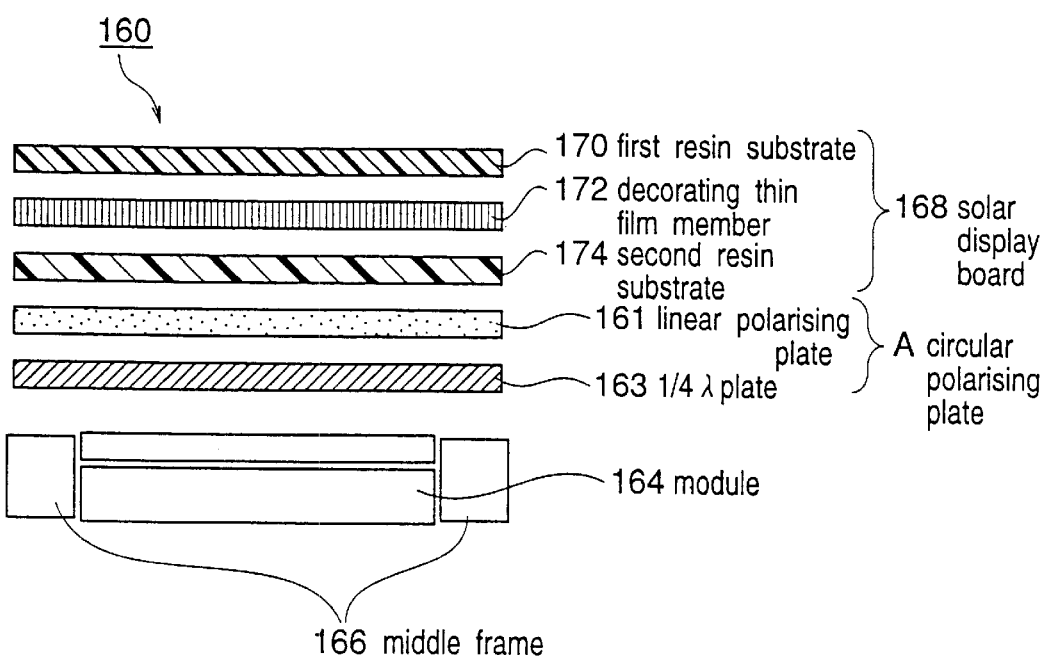
FIG. 19 is a partially enlarged sectional view showing a solar display board according to a fifteenth embodiment of the present invention.

As shown in FIG. 19, in a watch structure 160 according to the present embodiment, a solar cell 162 and a module 164 are fixed through a middle frame 166 to an outer case which is not shown in the same manner as that in the thirteenth embodiment.

A circular polarizing plate A constituted by a linear polarizing plate 161 and a ¼ λ plate 163 is provided above the middle frame 166. Furthermore, a solar display board 168 is provided thereabove.

The solar display board 168 according to the present embodiment has a first resin substrate 170, a decorating thin film member 172 and a second resin substrate 174 provided in this order.

The first resin substrate 170 and the second resin substrate 174 are formed of the same material as that of the resin substrate 110 of the display board 108 according to the thirteenth embodiment.

In the solar display board 168 according to the present embodiment, it is not necessary to form a pattern on the first resin substrate 170 and the second resin substrate 174. However, the pattern may be formed on either or both of them in the same manner as the resin substrate 110 of the display board 108 according to the thirteenth embodiment. In this case, the same method as that described in the thirteenth embodiment can be employed for forming the pattern, and preferably, a pattern transfer method using a thermal press by means of a pattern mold can be employed.

Moreover, the decorating thin film member 172 is the same as the decorating thin film member 152 according to the fourteenth embodiment.

Furthermore, it is desirable that the decorating thin film member 172 should be provided between the first resin substrate 170 and the second resin substrate 174 through one of adhesion using an adhesive, bonding using a glue, film bonding, bonding using an adhesive, melting bonding and high frequency bonding in consideration of a mechanical strength, a removing property and a transmittance.

A thickness of the first resin substrate 170 in the solar display board 168 is preferably 50 to 500 μm, and more preferably 80 to 200 μm. A thickness of the decorating thin film member 172 is preferably 5 to 300 μm, and more preferably 10 to 200 μm. A thickness of the second resin substrate 174 is preferably 50 to 500 μm, and more preferably 80 to 200 μm.

A whole thickness of the solar display board 168 including the resin substrates 170 and 174 and the decorating thin film member 172 is not particularly restricted but is preferably 110 to 1300 μm, and more preferably 300 to 500 μm.

With such a structure, a boundary line between the solar cell 162 and the middle frame 166, agate track generated through injection molding of the middle frame 166, and furthermore, a solar cell element dividing line of the solar cell 162 cannot be seen still more than those in the fourth embodiment. As a result, a variation in the design of the solar display board 168 can further be increased.

Furthermore, a decoration which is present on the upper or lower surface of the solar display board 168 such as a cloth, a paper, a rift, a grain, a pyroxene, a leaf, a petal, a shell, a leather and various transferred fine patterns to be the pattern portion of the first resin substrate 170 or the second resin substrate 174 and a decoration which is present in the middle thereof, for example, a thin layer article formed of a natural material such as a cloth, a paper, a shell or a wood of the decorating thin film member 172, a polarizing film, a coloring film, an electro forming foil or an electrode posited image produce a decorative property. As a result, the design having a three-dimensional effect and a feeling of high quality can be attained.

Consequently, the feeling of high quality of the solar display board 168 can be produced. In addition, it is possible to increase a variation in design in which the depth of a pattern and a three-dimensional effect are excellent. Thus, the feeling of high quality can be produced as goods. Moreover, the middle frame is provided. Therefore, various external shapes of the watch can be obtained in respect of the design.

Sixteenth Embodiment

Figure 20:
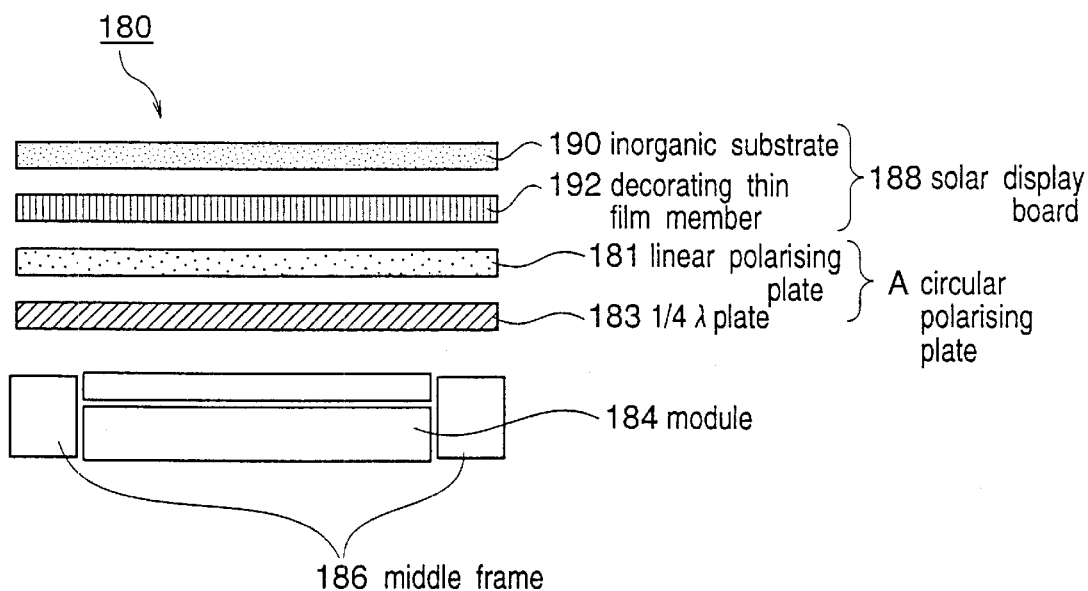
FIG. 20 is a partially enlarged sectional view showing a solar display board according to a sixteenth embodiment of the present invention.

As shown in FIG. 20, in a watch structure 180 according to the present embodiment, a solar cell 182 and a module 184 are fixed through a middle frame 186 to an outer case which is not shown in the same manner as that in the thirteenth embodiment.

A circular polarizing plate A constituted by a linear polarizing plate 181 and a ¼ λ plate 183 is provided above the middle frame 186. Furthermore, a solar display board 188 is provided thereabove.

The solar display board 188 according to the present embodiment has an inorganic substrate 190 having a pattern and a decorating thin film member 192 fixed to the inorganic substrate.

The inorganic substrate 190 is formed of a glass, a sapphire glass or a ceramic plate, and preferably the glass or the sapphire glass. The inorganic substrate 190 may be transparent or may be colored and translucent. A pattern is formed on the inorganic substrate 190 through machining such as engraving or rubbing, etching using hydrofluoric acid, the electric forming method and the pattern transfer method using a thermal press described in the thirteenth embodiment or the like. Moreover, the decorating thin film member 192 may be the same as the decorating thin film member 192 according to the fourteenth embodiment.

A thickness of the inorganic substrate 190 in the solar display board 188 is preferably 50 to 500 μm, and more preferably 200 to 300 μm. A thickness of the decorating thin film member 192 is preferably 5 to 300 μm, and more preferably 10 to 200 μm.

A whole thickness of the solar display board 188 including the inorganic substrates 190 and the decorating thin film member 192 is not particularly restricted but is preferably 60 to 800 μm, and more preferably 300 to 600 μm.

In this case, it is desirable that the inorganic substrate 190 and the decorating thin film member 192 should be fixed by one of adhesion using an adhesive, bonding using a glue, film bonding, bonding using an adhesive, melting bonding and high frequency bonding in consideration of a mechanical strength, a removing property and a transmittance.

With such a structure, a boundary line between the solar cell 182 and the middle frame 186, agate track generated through injection molding of the middle frame 186, and furthermore, a solar cell element dividing line of the solar cell 182 cannot be seen still more than those in the fourth embodiment. As a result, a variation in the design of the solar display board 188 can further be increased.

Furthermore, the pattern portion of the inorganic substrate 190 present on the upper surface of the solar display board 188 and a decoration which is present thereunder, for example, a thin layer article formed of a natural material such as a cloth, a paper, a shell or a wood of the decorating thin film member 192, a polarizing film, a coloring film, an electroforming foil or an electrodeposited image produce a decorative property. Therefore, the design having a three-dimensional effect and a feeling of high quality can be implemented.

Consequently, the feeling of high quality of the solar display board 188 can be produced. In addition, it is possible to increase a variation in design in which a decorative property is great and the depth of a pattern and a three-dimensional effect are excellent. Thus, the feeling of high quality can be produced as goods. Moreover, the middle frame is provided. Therefore, various external shapes of the watch can be obtained in respect of the design.

Seventeenth Embodiment

Figure 21:
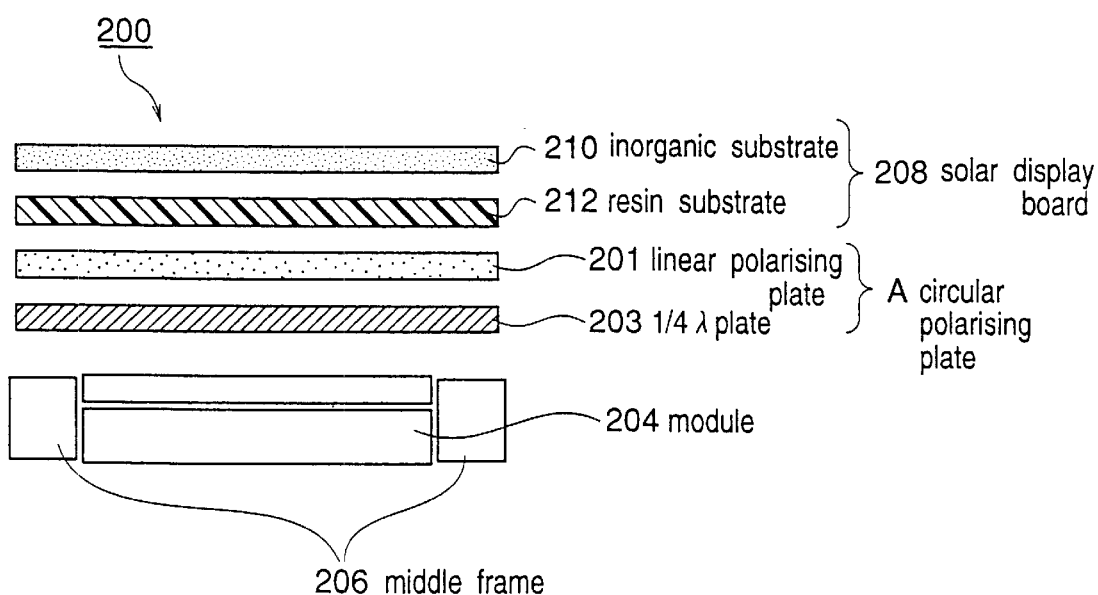
FIG. 21 is a partially enlarged sectional view showing a solar display board according to a seventeenth embodiment of the present invention.

As shown in FIG. 21, in a watch structure 200 according to the present embodiment, a solar cell 202 and a module 204 are fixed through a middle frame 206 to an outer case which is not shown in the same manner as that in the thirteenth embodiment.

A circular polarizing plate A constituted by a linear polarizing plate 201 and a ¼ λ plate 203 is provided above the middle frame 206. Furthermore, a solar display board 208 is provided thereabove.

The solar display board 208 according to the present embodiment is constituted by stacking an inorganic substrate 210 and a resin substrate 212.

In this case, the materials of the inorganic substrate 210 and the resin substrate 212 are the same as those of the inorganic substrate 190 according to the sixteenth embodiment and the resin substrate 110 according to the thirteenth embodiment, respectively. In the solar display board 208, a pattern does not need to be formed on the inorganic substrate 210 and the resin substrate 212 and a pattern may be formed on either or both of them. In particular, it is preferable that the pattern should be formed on the resin substrate 212 by using a pattern transfer method.

A thickness of the inorganic substrate 210 in the solar display board 208 is preferably 50 to 500 μm, and more preferably 200 to 300 μm. A thickness of the resin substrate 212 is preferably 50 to 500 μm, and more preferably 100 to 200 μm.

A whole thickness of the solar display board 208 including the inorganic substrate 210 and the resin substrate 212 is not particularly restricted but is preferably 100 to 1000 μm, and more preferably 300 to 600 μm.

It is desirable that the resin substrate 212 and the inorganic substrate 210 should be fixed through one of adhesion using an adhesive, bonding using a glue, film bonding, bonding using an adhesive, melting bonding and high frequency bonding in consideration of a mechanical strength, a removing property and a transmittance.

With such a structure, a boundary line between the solar cell 202 and the middle frame 206, a gate track generated through injection molding of the middle frame 206, and furthermore, a solar cell element dividing line of the solar cell 202 cannot be seen still more than those in the fourth embodiment. As a result, a variation in the design of the solar display board 208 can further be increased.

Furthermore, the pattern portion of the inorganic substrate 210 present on the upper surface of the solar display board 208 and a decoration which is present thereunder and is the pattern portion of the resin substrate 212 such as a cloth, a paper, a rift, a grain, a pyroxene, a leaf, a petal, a shell, a leather and various transferred fine patterns produce a decorative property. As a result, the design having a three-dimensional effect and a feeling of high quality can be implemented.

Consequently, the feeling of high quality of the solar display board 208 can be produced. In addition, it is possible to increase a variation in design in which a decorative property is great and the depth of a pattern and a three-dimensional effect are excellent. Thus, the feeling of high quality can be produced as goods. Moreover, the middle frame is provided. Therefore, various external shapes of the watch can be obtained in respect of the design.

Eighteenth Embodiment

Figure 22:
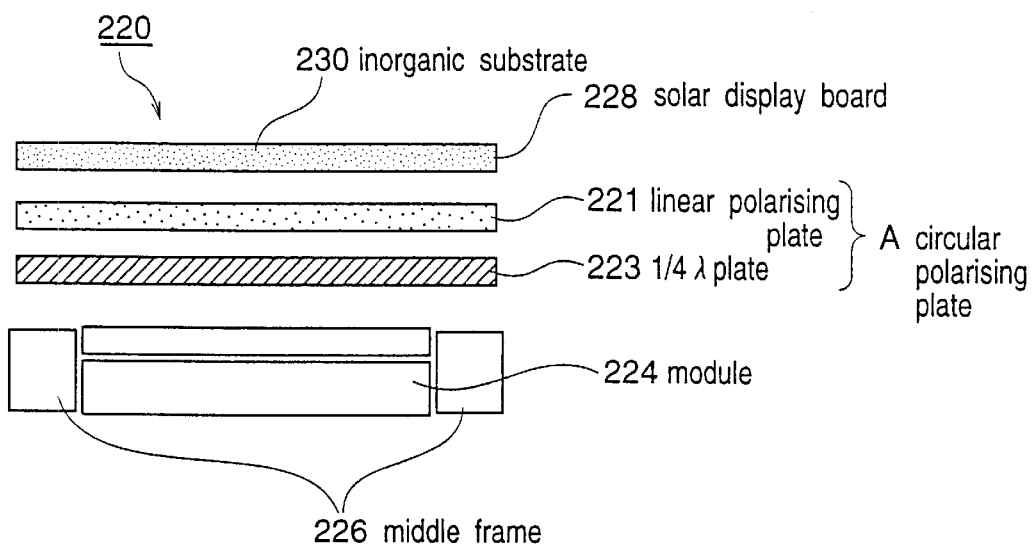
FIG. 22 is a partially enlarged sectional view showing a solar display board according to an eighteenth embodiment of the present invention.

As shown in FIG. 22, in a watch structure 220 according to the present embodiment, a solar cell 222 and a module 224 are fixed through a middle frame 226 to an outer case which is not shown in the same manner as that in the thirteenth embodiment.

A circular polarizing plate A constituted by a linear polarizing plate 221 and a ¼ λ plate 223 is provided above the middle frame 226. Furthermore, a solar display board 228 is provided thereabove.

The solar display board 228 according to the present embodiment is formed of only the inorganic substrate 230.

In this case, it is desirable that the material of the inorganic substrate 230 should be the same as that of the inorganic substrate 190 according to the sixteenth embodiment and should be colored with a pigment or a dye.

In the solar display board 228, moreover, a pattern does not need to be formed on the inorganic substrate 203 but is preferably formed.

A whole thickness of the solar display board 228 is not particularly restricted but is preferably 100 to 1000 µm, and more preferably 300 to 600 µm.

With such a structure, a boundary line between the solar cell 222 and the middle frame 226, agate track generated through injection molding of the middle frame 226, and furthermore, a solar cell element dividing line of the solar cell 222 cannot be seen still more than those in the fourth embodiment. As a result, a variation in the design of the solar display board 228 can further be increased.

Furthermore, a decoration of the pattern portion of the inorganic substrate 230 present on the upper surface of the solar display board 228 produces a decorative property so that the design having a three-dimensional effect and a feeling of high quality can be implemented.

Consequently, the feeling of high quality of the solar display board 228 can be produced. In addition, it is possible to increase a variation in design in which a decorative property is great and the depth of a pattern and a three-dimensional effect are excellent. Thus, the feeling of high quality can be produced as goods. Moreover, the middle frame is provided. Therefore, various external shapes of the watch can be obtained in respect of the design.

Nineteenth Embodiment

Figure 23:
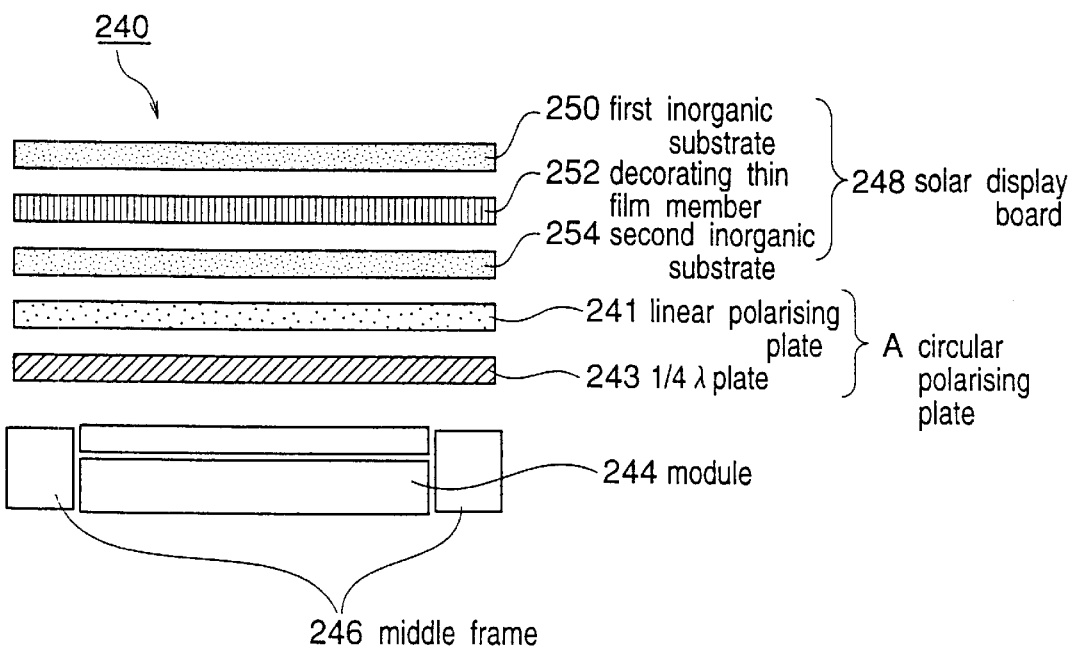
FIG. 23 is a partially enlarged sectional view showing a solar display board according to a nineteenth embodiment of the present invention.

As shown in FIG. 23, in a watch structure 240 according to the present embodiment, a solar cell 242 and a module 244 are fixed through a middle frame 246 to an outer case which is not shown in the same manner as that in the thirteenth embodiment.

A circular polarizing plate A constituted by a linear polarizing plate 241 and a ¼λ plate 243 is provided above the middle frame 246. Furthermore, a solar display board 248 is provided thereabove.

The solar display board 248 according to the present embodiment is formed by stacking a first inorganic substrate 250, a decorating thin film member 252 and a second inorganic substrate 254.

The first inorganic substrate 250 and the second inorganic substrate 254 can be the same as the inorganic substrate 190 according to the sixteenth embodiment.

In the solar display board 248, a pattern does not need to be formed on the first inorganic substrate 250 and the second inorganic substrate 254 but is desirably formed on either or both of them. Moreover, the decorating thin film member 252 can be the same as the decorating thin film member 152 according to the fourteenth embodiment.

A thickness of the first inorganic substrate 250 in the solar display board 248 is preferably 50 to 500 µm. and more preferably 200 to 300 µm. A thickness of the decorating thin film member 252 is preferably 5 to 300 µm, and more preferably 10 to 200 µm. A thickness of the second inorganic substrate 254 is preferably 50 to 500 µm, and more preferably 200 to 300 µm.

A whole thickness of the solar display board 248 including the inorganic substrates 250 and 254 and the decorating thin film member 252 is not particularly restricted but is preferably 110 to 1300 µm, and more preferably 300 to 600 µm.

It is desirable that the decorating thin film member 252 should be fixed between the first inorganic substrate 250 and the second inorganic substrate 254 through one of adhesion using an adhesive, film bonding, bonding using an adhesive, melting bonding and high frequency bonding in consideration of a mechanical strength, a removing property and a transmittance.

With such a structure, a boundary line between the solar cell 242 and the middle frame 246, agate track generated through injection molding of the middle frame 246, and furthermore, a solar cell element dividing line of the solar cell 242 cannot be seen still more than those in the fourth embodiment. As a result, a variation in the design of the solar display board 248 can further be increased.

Furthermore, a decoration of the pattern portions of the inorganic substrates 250 and 254 which are present on the upper and lower surfaces of the solar display board 248 and a decoration which is present in the middle thereof, for example, a thin layer article formed of a natural material such as a cloth, a paper, a shell or a wood, a polarizing film, a coloring film, an electroforming foil or an electrodeposited image in the decorating thin film member 252 produce a decorative property. As a result, the design having a three-dimensional effect and a feeling of high quality can be implemented.

Consequently, the feeling of high quality of the solar display board 248 can be produced. In addition, it is possible to increase a variation in design in which a decorative property is great and the depth of a pattern and a three-dimensional effect are excellent. Thus, the feeling of high quality can be produced as goods. Moreover, the middle frame is provided. Therefore, various external shapes of the watch can be obtained in respect of the design.

Twentieth Embodiment

Figure 24:
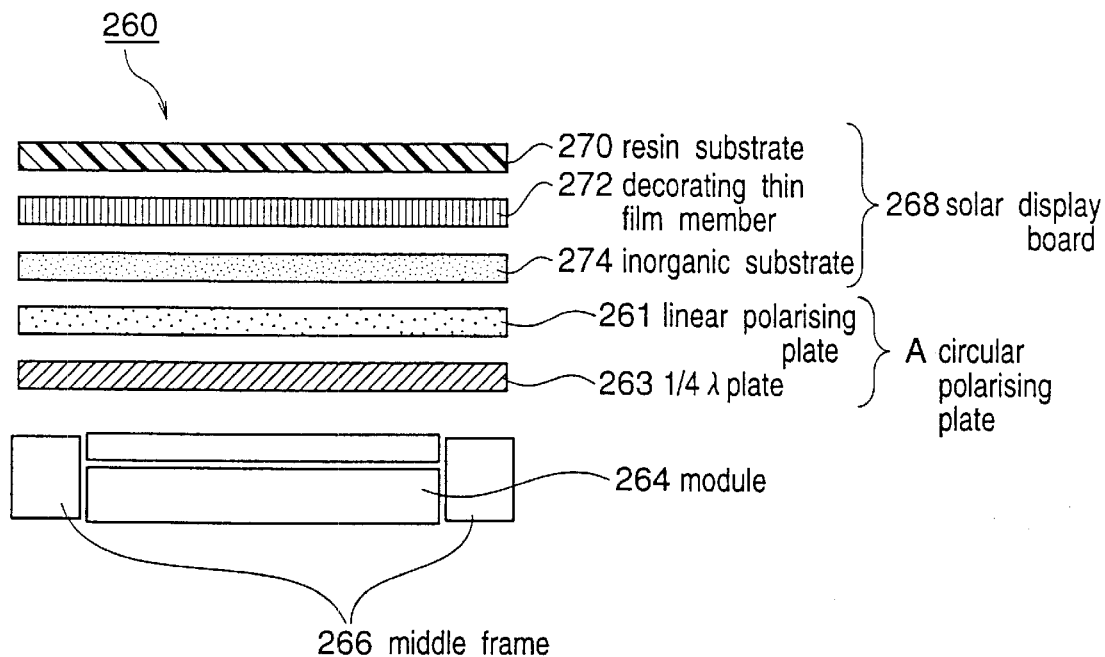
FIG. 24 is a partially enlarged sectional view showing a solar display board according to a twentieth embodiment of the present invention.

As shown in FIG. 24, in a watch structure 260 according to the present embodiment, a solar cell 262 and a module 264 are fixed through a middle frame 266 to an outer case which is not shown in the same manner as that in the thirteenth embodiment.

A circular polarizing plate A constituted by a linear polarizing plate 261 and a ¼ plate 263 is provided above the middle frame 266. Furthermore, a solar display board 268 is provided thereabove.

The solar display board 268 according to the present embodiment is constituted by stacking a resin substrate 270, a decorating thin film member 272 and an inorganic substrate 274 in this order.

In this case, the resin substrate 270, the decorating thin film member 272 and the inorganic substrate 274 can be the same as the resin substrate 110 according to the thirteenth embodiment, the decorating thin film member 152 according to the fourteenth embodiment and the inorganic substrate 190 according to the sixteenth embodiment, respectively.

Moreover, a pattern does not need to be formed on the resin substrate 270 and the inorganic substrate 274 but is desirably formed on either or both of them.

In this case, one or more resin substrates, decorating thin film members and inorganic substrates may be used and may have three or more layers, respectively. Moreover, the order of the stack of the resin substrate, the decorating thin film member and the in organic substrate is not particularly restricted. Furthermore, two or more kinds of resin substrates may be used. Similarly, two or more kinds of decorating thin film members and inorganic substrates may be used, respectively.

Such a solar display board 268 has the following preferable layer structures including the structure shown in FIG. 24, (1) resin substrate/decorating thin film member/resin substrate/inorganic substrate, (2) resin substrate/decorating thin film member/inorganic substrate/resin substrate, (3) decorating thin film member/inorganic substrate/resin substrate, and (4) inorganic substrate/decorating thin film member/ inorganic substrate/resin substrate.

In this case, a thickness of the resin substrate is preferably 50 to 500 $\mu$m and more preferably 80 to 200 $\mu$m per layer. A thickness of the decorating thin film member is preferably 5 to 300 $\mu$m and more preferably 10 to 200 $\mu$m per layer. A thickness of the inorganic substrate is preferably 50 to 500 $\mu$m and more preferably 200 to 300 $\mu$m per layer.

A whole thickness of the solar display board 268 including the resin substrate, the decorating thin film member and the inorganic substrate is not particularly restricted but is preferably 110 to 1300 $\mu$m, and more preferably 300 to 600 $\mu$m.

With such a structure, a boundary line between the solar cell 262 and the middle frame 266, a gate track generated through injection molding of the middle frame 266, and furthermore, a solar cell element dividing line of the solar cell 262 cannot be seen still more than those in the fourth embodiment. Therefore, a variation in the design of the solar display board 268 can further be increased.

Furthermore, a decoration such as a cloth, a paper, a rift, a grain, a pyroxene, a leaf, a petal, a shell, a leather and various transferred fine patterns to be the pattern portion of the resin substrate 270, a decoration of the pattern portion of the inorganic substrate 274 and a decoration of the decorating thin film member 272 such as a thin layer article formed of a natural material, for example, a cloth, a paper, a shell or a wood, a polarizing film, a coloring film, an electroforming foil or an electrode posited image produce a decorative property. As a result, the design having a three-dimensional effect and a feeling of high quality can be implemented.

Consequently, the feeling of high quality of the solar display board 248 can be produced. In addition, it is possible to increase a variation in design in which a decorative property is great and the depth of a pattern and a three-dimensional effect are excellent. Thus, the feeling of high quality can be produced as goods. Moreover, the middle frame is provided. Therefore, various external shapes of the watch can be obtained in respect of the design.

Twenty-first Embodiment

Figure 25:
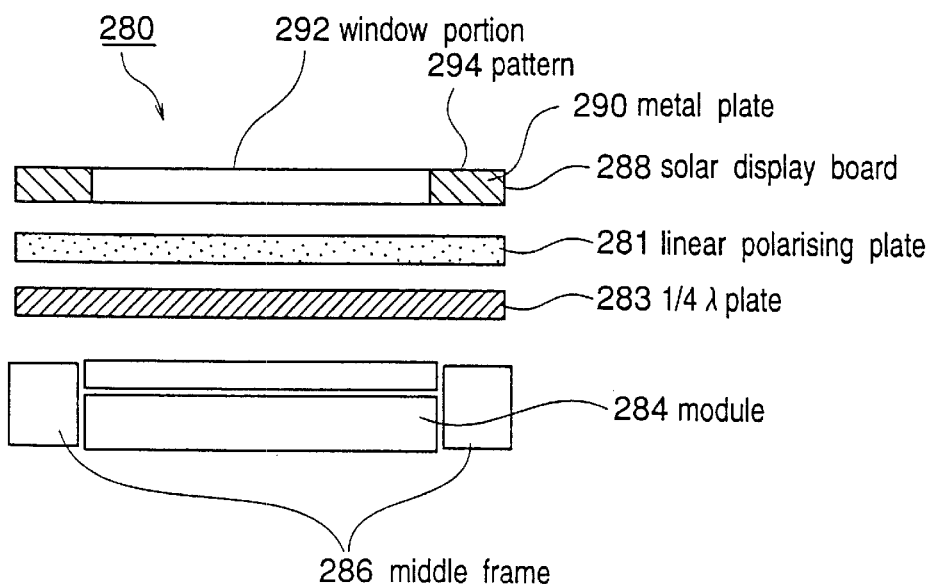
FIG. 25 is a partially enlarged sectional view showing a solar display board according to a twenty-first embodiment of the present invention.
Figure 26A:
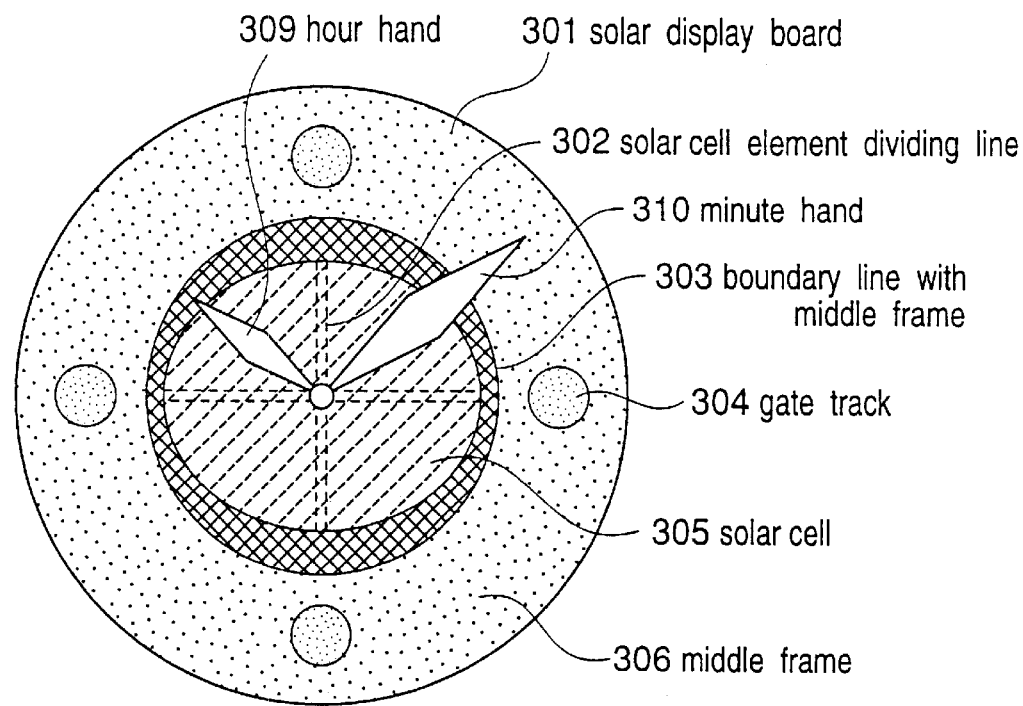
FIGS. 26(a)–26(b) show the state of the inside of a watch case according to a conventional example, FIG. 26(a) being a front view showing the inside of the watch case seen from above and FIG. 26(b) being a schematic sectional view showing the inside of the watch case.
Figure 26B:
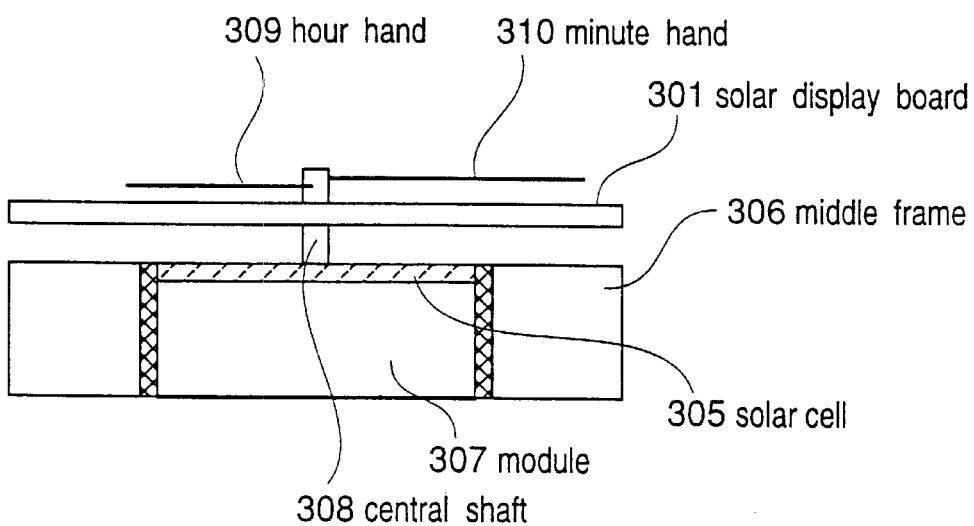

As shown in FIG. 25, in a watch structure 280 according to the present embodiment, a solar cell 282 and a module 284 are fixed through a middle frame 286 to an outer case which is not shown in the same manner as that in the thirteenth embodiment.

A circular polarizing plate A constituted by a linear polarizing plate 281 and a ¼ $\lambda$ plate 283 is provided above the middle frame 286. Furthermore, a solar display board 288 is provided thereabove.

The solar display board 288 according to the present embodiment is constituted by a metal plate 290.

The metal plate 290 has a window portion 292 of a display section formed in a central part thereof through machining such as punching, and a pattern 294 is formed on a surface thereof.

While the metal plate 290 is not particularly restricted but a metal, for example, phosphor bronze, titanium, stainless steel such as SUS 304, a copper alloy such as brass, nickel silver or the like can be used.

As a method of forming a pattern on the surface of the metal plate 290, a pattern forming method of forming a pattern through a press using a pattern mold and a machining method using engraving, rubbing or the like can be used.

For the metal plate 290, it is also possible to use a metal thin film having a pattern shape which is obtained by forming a pattern on a metal substrate through a photoresist, plating the pattern with a metal, forming a pattern metal thin layer, coating an adhesive on the surface of the metal thin film layer and removing the metal substrate.

It is desirable that the metal plate 290 should be fixed to the upper surface of the circular polarizing plate A through bonding using a glue, film bonding, bonding using an adhesive or the like in consideration of a mechanical strength, a removing property and a transmittance.

With such a structure, a boundary line between the solar cell 282 and the middle frame 286, agate track generated through injection molding of the middle frame 286, and furthermore, a solar cell element dividing line of the solar cell 282 cannot be seen still more than those in the fourth embodiment so that a variation in the design of the solar display board 288 can further be increased.

Furthermore, the decorative property of the metal plate 290 which is present on the upper surface of the solar display board 288 can implement the design having a three-dimensional effect and a feeling of high quality.

Consequently, the feeling of high quality of the solar display board 288 can be produced. In addition, it is possible to increase a variation in design in which a decorative property is great and the depth of a pattern and a three-dimensional effect are excellent. Thus, the feeling of high quality can be produced as goods. Moreover, the middle frame is provided. Therefore, various external shapes of the watch can be obtained in respect of the design.

An auxiliary member formed of a transparent resin such as polycarbonate can also be provided between the solar display board according to each of the thirteenth to twenty-first embodiments and the circular polarizing plate A to adjust a portion between the circular polarizing plate A and the solar display board to the thickness of an outer case, which is not shown.

On the surface of the solar display board according to the embodiment of the present invention, moreover, a display portion (a time scale of a watch), the name of a manufacturer, a type and the like can be displayed by means of printing or a decorating member (a time letter, a mark or the like) to be fabricated by electroforming and fixed with an adhesive can be provided.

Furthermore, while the description has been given to only the watch in the above-mentioned embodiments, the present invention is not restricted thereto but the same effects can be obtained, that is, a variation in design can be increased through utilization for other electronic apparatuses having a solar cell, for example, an electronic calculator, a radio, a battery charger or the like. Thus, various changes can be made without departing from the scope of the present invention.

According to the present invention, the circular polarizing plate constituted by the linear polarizing plate and at least one phase difference plate is provided between the middle frame for fixing the module having the solar cell to the case and the solar display board. Consequently, a boundary line between the solar cell and the middle frame, a gate track generated through injection molding of the middle frame, and furthermore, a solar cell element dividing line of the solar cell cannot be seen. As a result, a variation in design of the solar display board can be increased. Moreover, the color of the solar display board is deepened so that a feeling of high quality can be obtained as goods.

According to the present invention, furthermore, the surface of the circular polarizing plate is provided with a solar display board constituted by a resin substrate having a pattern, an inorganic substrate having a pattern or a decorating thin film member or a combination thereof. Therefore, a decorative property is great, the pattern becomes rich and an excellent three-dimensional effect can be obtained. Through a combination of two or more patterns or two or more materials, moreover, it is possible to manufacture a display board having a better feeling of beauty than ever. Thus, a design variation can be increased.

What is claimed is:

1. A display device for an electronic apparatus comprising a solar cell, and a solar cell display board for transmitting light having a watch dial in addition to the solar cell, wherein a circular polarizing plate for transmitting light is provided between the solar cell and the solar display board.

2. The display device for an electronic apparatus according to claim 1, wherein the solar cell, the solar cell display board and the circular polarizing plate have identical outer shapes.

3. The display device for an electronic apparatus according to claim 1, wherein the circular polarizing plate comprises a linear polarizing plate and a phase difference plate.

4. The display device for an electronic apparatus according to claim 3, a wherein the circular polarizing plate is positioned on an outer case in a planar direction.

5. The display device for an electronic apparatus according to claim 3, wherein an adhesive layer is formed on any of boundaries between the solar display board and the linear polarizing plate, between the linear polarizing plate and the phase difference plate, and between the phase difference plate and the solar cell or a middle frame.

6. The display device for an electronic apparatus according to claim 3, wherein a diffusion layer is formed on any of boundaries between the solar display board and the linear polarizing plate, between the linear polarizing plate and the phase difference plate, and between the phase difference plate and the solar cell or a middle frame.

7. The display device for an electronic apparatus according to claim 3, wherein the linear polarizing plate transmits a linear polarizing component turned in a constant direction and absorbs a linear polarizing component in a direction orthogonal thereto.

8. The display device for an electronic apparatus according to claim 3, wherein the linear polarizing plate transmits a linear polarizing component turned in a constant direction and reflects a linear polarizing component in a direction orthogonal thereto.

9. The display device for an electronic apparatus according to claim 5, wherein $\lambda$ is the wavelength of the natural light incident on the linear polarizing plate and the phase difference plate is formed of a ¼λ plate or the ¼λ plate a ½λ plate.

10. The display device for an electronic apparatus according to claim 9, wherein the circular polarizing plate is provided with the linear polarizing plate and the ¼λ plate in this order in the direction of incidence of light.

11. The display device for an electronic apparatus according to claim 10, wherein the circular polarizing plate is provided between a hand and the solar cell.

12. The display device for an electronic apparatus according to claim 10, wherein the circular polarizing plate is provided between a liquid crystal panel and the solar cell.

13. The display device for an electronic apparatus according to claim 1, wherein the solar display board includes a resin substrate having a pattern.

14. The display device for an electronic apparatus according to claim 13, wherein the solar display board includes a resin substrate having a pattern and a decorating thin film member fixed to the resin substrate.

15. The display device for an electronic apparatus according to claim 1, wherein the solar display board has a first resin substrate, a decorating thin film member and a second resin substrate provided therein.

16. The display device for an electronic apparatus according to claim 1, wherein the solar display board includes an inorganic substrate having a pattern selected from a glass, a sapphire glass and a ceramic plate.

17. The display device for an electronic apparatus according to claim 16, wherein the solar display board further includes a decorating thin film member fixed to the inorganic substrate.

18. The display device for an electronic apparatus according to claim 16, wherein the solar display board is further provided with a resin substrate.

19. The display device for an electronic apparatus according to claim 1, wherein the solar display board is provided with a first inorganic substrate selected from a glass, a sapphire glass and a ceramic plate, a decorating thin film member, and a second inorganic substrate selected from a glass, a sapphire glass and a ceramic plate.

20. The display device for an electronic apparatus according to claim 1, wherein the solar display board uses one or more of a resin substrate, a decorating thin film member and an inorganic substrate selected from a glass, a sapphire glass and a ceramic plate in three or more layers.

21. The display device for an electronic apparatus according to claim 14, wherein the decorating thin film member is a thin layer article formed of a natural material selected from the group consisting of a cloth, a paper, a shell or a wood, a ceramic sheet, a polarizing film, a coloring film, an electroforming foil, an electrodeposited image, an etched image and a hologram image.

22. The display device for an electronic apparatus according to claim 15, wherein the decorating thin film member is a thin layer article formed of a natural material selected from the group consisting of a cloth, a paper, a shell or a wood, a ceramic sheet, a polarizing film, a coloring film, an electroforming foil, an electrodeposited image, an etched image and a hologram image.

23. The display device for an electronic apparatus according to claim 17, wherein the decorating thin film member is a thin layer article formed of a natural material selected from the group consisting of a cloth, a paper, a shell or a wood, a ceramic sheet, a polarizing film, a coloring film, an electroforming foil, an electrodeposited image, an etched image and a hologram image.

24. The display device for an electronic apparatus according to claim 19, wherein the decorating thin film member is a thin layer article formed of a natural material selected from the group consisting of a cloth, a paper, a shell or a wood, a ceramic sheet, a polarizing film, a coloring film, an electroforming foil, an electrode posited image, an etched image and a hologram image.

25. The display device for an electronic apparatus according to claim 20, wherein the decorating thin film member is a thin layer article formed of a natural material selected from the group consisting of a cloth, a paper, a shell or a wood, a ceramic sheet, a polarizing film, a coloring film, an electroforming foil, an electrodeposited image, an etched image and a hologram image.

26. The display device for an electronic apparatus according to claim 15, wherein a pattern is given to one or more of the first resin substrate and the second resin substrate.

27. The display device for an electronic apparatus according to claim 18, wherein a pattern is given to the resin substrate.

28. The display device for an electronic apparatus according to claim 19, wherein a pattern is given to one or both of the first inorganic substrate and the second inorganic substrate.

29. The display device for an electronic apparatus according to claim 20, wherein a pattern is given to the resin substrate or the inorganic substrate.

30. The display device for an electronic apparatus according to claim 13, wherein the resin substrate is a transparent or colored translucent substrate.

31. The display device for an electronic apparatus according to claim 15, wherein one or both of the first resin substrate and the second resin substrate is a transparent or colored translucent substrate.

32. The display device for an electronic apparatus according to claim 16, wherein the inorganic substrate is a transparent or colored translucent substrate.

33. The display device for an electronic apparatus according to claim 19, wherein one or both of the first inorganic substrate and the second inorganic substrate is a transparent or colored translucent substrate.

34. The display device for an electronic apparatus according to claim 20, wherein the resin substrate or the inorganic substrate is a transparent or colored translucent substrate.

35. The display device for an electronic apparatus according to claim 1, wherein the solar display board has a pattern and includes a metal plate having a window portion opened.

36. A method of manufacturing a display device for an electronic apparatus according to claim 13, wherein the resin substrate is bonded integrally with the circular polarizing plate through a thermal press and a pattern is transferred to the resin substrate by a pattern transfer method through the thermal press using a pattern mold.

37. A method of manufacturing a display device for an electronic apparatus according to claim 15, wherein one or both of the first resin substrate and the second resin substrate is bonded integrally with the circular polarizing plate through a thermal press and a pattern is transferred to one or both of the first resin substrate and the second resin substrate by a pattern transfer method through the thermal press using a pattern mold.

38. A method of manufacturing a display device for an electronic apparatus according to claim 16, wherein the inorganic substrate is bonded integrally with the circular polarizing plate through a thermal press and a pattern is transferred to the inorganic substrate by a pattern transfer method through the thermal press using a pattern mold.

39. A method of manufacturing a display device for an electronic apparatus according to claim 19, wherein one or both of the first inorganic substrate and the second inorganic substrate is bonded integrally with the circular polarizing plate through a thermal press and a pattern is transferred to one or both of the first inorganic and the second inorganic substrate by a pattern transfer method through the thermal press using a pattern mold.

40. A method of manufacturing a display device for an electronic apparatus according to claim 20, wherein the resin substrate or the inorganic substrate is bonded integrally with the circular polarizing plate through a thermal press and pattern is transferred to the resin substrate or the inorganic substrate by a pattern transfer method through the thermal press using a pattern mold.

41. The method of manufacturing a display device for an electronic apparatus according to claim 36 wherein the resin substrate is bonded to the circular polarizing plate with an adhesive interposed therebetween.

42. The method of manufacturing a display device for an electronic apparatus according to claim 37, wherein the first resin substrate or the second resin substrate is bonded to the circular polarizing plate with an adhesive interposed therebetween.

43. The method of manufacturing a display device for an electronic apparatus according to claim 38, wherein the inorganic substrate is bonded to the circular polarizing plate with an adhesive interposed therebetween.

44. The method of manufacturing a display device for an electronic apparatus according to claim 39, wherein the first inorganic substrate or the second inorganic substrate is bonded to the circular polarizing plate with an adhesive interposed therebetween.

45. The method of manufacturing a display device for an electronic apparatus according to claim 40, wherein the resin substrate or the inorganic substrate is bonded to the circular polarizing plate with an adhesive interposed therebetween.

46. The method of manufacturing a display device for an electronic apparatus according to claim 36, wherein the pattern mold serves to mold a pattern of an article having the pattern by using an electric forming method.

47. The method of manufacturing a display device for an electronic apparatus according to claim 37, wherein the pattern mold serves to mold a pattern of an article having the pattern by using an electric forming method.

48. The method of manufacturing a display device for an electronic apparatus according to claim 38, wherein the pattern mold serves to mold a pattern of an article having the pattern by using an electric forming method.

49. The method of manufacturing a display device for an electronic apparatus according to claim 39, wherein the pattern mold serves to mold a pattern of an article having the pattern by using an electric forming method.

50. The method of manufacturing a display device for an electronic apparatus according to claim 40, wherein the pattern mold serves to mold a pattern of an article having the pattern by using an electric forming method.

51. A display device for an electronic apparatus comprising a solar cell and a middle frame for fixing a module having the solar cell to a case, and a circular polarizing plate for transmitting light being provided on the front side of the middle frame and the solar cell in a direction of incidence of light.

52. The display device for an electronic apparatus according to claim 51, further comprising a solar cell display board for transmitting light, the circular polarizing plate for transmitting light being provided between the solar cell display board and the middle frame.

53. The display device for an electronic apparatus according to claim 52, wherein the solar cell display board, the middle frame and the circular polarizing plate have identical outer shapes.

* * * * *

UNITED STATES PATENT AND TRADEMARK OFFICE
CERTIFICATE OF CORRECTION

PATENT NO. : 6,518,493 B1
DATED : February 11, 2003
INVENTOR(S) : Tomomi Murakami et al.

It is certified that error appears in the above-identified patent and that said Letters Patent is hereby corrected as shown below:

Column 4,
Line 51, "an in organic" should read -- an inorganic --.

Column 5,
Line 52, "FIG. 16" should read -- FIG. 18 --.

Column 6,
Line 64, "45° λinto" should read -- 45° into --.

Column 7,
Line 16, "1/4 λ0" should read -- 1/4 λ --.
Line 30, "plate. 112" should read -- plate 112 -- (delete period).

Column 8,
Line 27, "hoard 21" should read -- board 21 --.

Column 9,
Line 18, "There fore" should read -- Therefore --.

Column 10,
Line 2, after "design" insert period (.).
Line 60, "agate track" should read -- a gate track --.

Column 11,
Line 52, "reflection type In" should read -- reflection type. In --.

Column 14,
Line 55, "mold 12 opposed" should read -- mold 120 is opposed --.
Line 67, "kb/cm$^2$" should read -- kg/cm$^2$ --.

Column 15,
Line 39, "having a pat tern" should read -- having a pattern --.
Line 63, "there with." should read -- therewith. --.

UNITED STATES PATENT AND TRADEMARK OFFICE
CERTIFICATE OF CORRECTION

PATENT NO. : 6,518,493 B1
DATED : February 11, 2003
INVENTOR(S) : Tomomi Murakami et al.

It is certified that error appears in the above-identified patent and that said Letters Patent is hereby corrected as shown below:

Column 16,
Line 18, "agate track" should read -- a gate track --.

Column 18,
Line 32, "agate track" should read -- a gate track --.
Line 47, "an electro forming" should read -- an electroforming --.
Line 47, "electrode posited" should read -- electrodeposited --.

Column 19,
Line 35, "agate track" should read -- a gate track --.

Column 21,
Line 14, "agate track" should read -- a gate track --.
Lines 21-22, "of the in organic" should read -- of the inorganic --.
Line 60, "500 μm. and" should read -- 500 μm, and --.

Column 22,
Line 12, "agate track" should read -- a gate track --.
Line 46, "1/4" should read -- 1/4 λ --.
Line 67, "the in organic" should read -- the inorganic --.

Column 23,
Line 40, "electrode posited" should read -- electrodeposited --.

Column 24,
Line 22, "agate track" should read -- a gate track --.

Column 25,
Line 32, "3, a wherein" should read -- 3, wherein --.
Line 59, "plate a" should read -- plate and a --.

UNITED STATES PATENT AND TRADEMARK OFFICE
CERTIFICATE OF CORRECTION

PATENT NO. : 6,518,493 B1
DATED : February 11, 2003
INVENTOR(S) : Tomomi Murakami et al.

It is certified that error appears in the above-identified patent and that said Letters Patent is hereby corrected as shown below:

Column 28,
Lines 2-3, "and pattern" should read -- and a pattern --.

Signed and Sealed this

First Day of July, 2003

JAMES E. ROGAN
*Director of the United States Patent and Trademark Office*